(12) United States Patent
Takahashi et al.

(10) Patent No.: US 6,169,307 B1
(45) Date of Patent: Jan. 2, 2001

(54) NONVOLATILE SEMICONDUCTOR MEMORY DEVICE COMPRISING A MEMORY TRANSISTOR, A SELECT TRANSISTOR, AND AN INTERMEDIATE DIFFUSION LAYER

(75) Inventors: Keita Takahashi, Nara; Masafumi Doi; Hiroyuki Doi, both of Kyoto; Nobuyuki Tamura; Yasushi Okuda, both of Osaka, all of (JP)

(73) Assignee: Matsushita Electronics Corporation, Osaka (JP)

( * ) Notice: Under 35 U.S.C. 154(b), the term of this patent shall be extended for 0 days.

(21) Appl. No.: 09/206,560

(22) Filed: Dec. 8, 1998

(30) Foreign Application Priority Data

Dec. 10, 1997 (JP) .................................................. 9-339548

(51) Int. Cl.$^7$ ................................................ G01L 29/788
(52) U.S. Cl. ...................................... 257/315; 365/185.28
(58) Field of Search ................................... 257/315, 324, 257/213; 365/185.28, 185.01

(56) References Cited

U.S. PATENT DOCUMENTS

| 5,267,209 | 11/1993 | Yoshida | 365/218 |
|---|---|---|---|
| 5,426,611 | 6/1995 | Maruyama | 365/218 |
| 5,457,652 | 10/1995 | Brahmbhatt | 365/185.06 |
| 5,513,319 | 4/1996 | Smayling et al. | 365/185.27 |
| 5,559,735 | 9/1996 | Ono et al. | 365/185.17 |
| 5,687,118 | * 11/1997 | Chang | 365/185.19 |
| 5,793,081 | 8/1998 | Tomioka et al. | 257/319 |
| 5,867,425 | * 2/1999 | Wong | 365/185.08 |
| 5,896,315 | * 4/1999 | Wong | 365/185.01 |

FOREIGN PATENT DOCUMENTS

| 0676811 | 6/1995 | (EP) . |
|---|---|---|
| 0778623 | 11/1997 | (EP) . |
| 8-279566 | 10/1996 | (JP) . |

* cited by examiner

*Primary Examiner*—David Nelms
*Assistant Examiner*—Hoai V. Ho
(74) *Attorney, Agent, or Firm*—McDermott, Will & Emery

(57) ABSTRACT

A memory transistor and a select transistor are disposed side by side on a semiconductor substrate between source/drain diffusion layers thereof, with an intermediate diffusion layer interposed therebetween. The memory transistor includes: a gate insulating film having such a thickness as to allow tunneling current to pass therethrough; a floating gate electrode; an interelectrode insulating film; and a control gate electrode. The select transistor includes a gate insulating film and a select gate electrode. Tunneling current, allowing electrons to pass through the gate insulating film under the floating gate electrode, is utilized during the removal and injection of electrons from/into the floating gate electrode. As a result, higher reliability can be attained and rewriting can be performed at a lower voltage. Also, since the select transistor is provided, reading can also be performed at a lower voltage. Improvement of reliability and rewrite and read operations at respective lower voltages are realized for a nonvolatile semiconductor memory device, in which a memory cell includes a floating gate electrode and a control gate electrode.

19 Claims, 35 Drawing Sheets

NONVOLATILE SEMICONDUCTOR MEMORY DEVICE COMPRISING A MEMORY TRANSISTOR, A SELECT TRANSISTOR, AND AN INTERMEDIATE DIFFUSION LAYER

BACKGROUND OF THE INVENTION

The present invention relates to a nonvolatile semiconductor memory device and a method for driving the same. More particularly, the present invention relates to a nonvolatile semiconductor memory device functioning as a flash EEPROM employing a two-layer gate electrode structure including floating gate and control gate electrodes and to a method for driving the same.

In recent years, a flash EEPROM is increasingly required to perform a rewrite operation using a single power supply at a low voltage and a high-speed read operation at a low voltage. A "low voltage" herein refers to about 1.5 V to about 3.3 V.

Various types of flash EEPROMs are now available. For example, a flash EEPROM developed by a certain corporation injects channel hot electrons (CHE) from a drain into a floating gate electrode while writing, and ejects the electrons out of the electrode into a source by using FN tunneling current while erasing. Hereinafter, a flash EEPROM of this type will be called a "CHE-type flash EEPROM". The CHE-type flash EEPROM is advantageous in that the circuit configuration and fabrication process thereof can be implemented by extending EPROM technologies. However, since current of about 500 μA should be consumed per cell for writing, a rewrite operation using a single power supply at 5 V can be performed relatively easily. But a rewrite operation using a single power supply at 2.5 V or less is hard to realize.

Another flash EEPROM, ejecting electrons out of a floating gate electrode into a drain while writing and injecting electrons into the floating gate electrode while erasing by using, in both operations, FN tunneling current over the entire surface of a channel, has prevailed in the art recently. Examples of flash EEPROMs of this type include a DINOR-type flash EEPROM disclosed in U.S. Pat. No. 5,283,758 and an AND-type flash EEPROM disclosed in U.S. Pat. No. 5,592,415. Flash EEPROMs of those types use the FN tunneling current for both writing and erasing. Accordingly, the level of current required for writing and erasing may be low and therefore a rewrite operation can be performed using a single power supply at a low voltage (e.g., 2.5 V). Hereinafter, a flash EEPROM of such a type will be called a "drain-side FN—FN type flash EEPROM".

A memory cell structure for a drain-side FN—FN type flash EEPROM and a method for driving the same will be described, and the problems thereof will be clarified. And then another conventional nonvolatile semiconductor memory device and a method for driving the same will be described as an exemplary means for solving the problems. It is noted that the drain-side FN—FN type flash EEPROM exemplified below is supposed to be a DINOR-type flash EEPROM.

First, a memory cell structure for a drain-side FN—FN type flash EEPROM and a method for driving the same will be described.

FIG. 24 is a cross-sectional view illustrating an exemplary memory cell structure for a drain-side FN—FN type flash EEPROM. As shown in FIG. 24, the memory cell includes: a P-type semiconductor substrate 101; a deep N-type well 102; a P-type well 103; a gate insulating film 104; a floating gate electrode 105; an interelectrode insulating film 106; a control gate electrode 107; a drain diffusion layer 108; and a source diffusion layer 109.

The flash EEPROM shown in FIG. 24 has fundamentally the same memory cell structure as that of the CHE-type flash EEPROM, but is somewhat different from the latter in the shapes of the diffusion layers. Specifically, in a memory cell of the CHE-type flash EEPROM, a source diffusion layer is deeper than a drain diffusion layer. Conversely, in a memory cell of the drain-side FN—FN type flash EEPROM, the drain diffusion layer 108 is deeper than the source diffusion layer 109. This structural difference comes from the locations of the tunneling current utilized by the flash EEPROMs of these two types. That is to say, the CHE-type flash EEPROM uses the tunneling current flowing between the source diffusion layer and the floating gate electrode, whereas the drain-side FN—FN type flash EEPROM uses the tunneling current flowing between the drain diffusion layer 108 and the floating gate electrode 105.

Next, the array structure of the drain-side FN—FN type flash EEPROM and an erasing method thereof will be described. FIG. 25(a) is an electric circuit diagram illustrating voltages applied for simultaneously erasing data from all the memory cells in the drain-side FN—FN type flash EEPROM as a conventional nonvolatile semiconductor memory device. And FIG. 25(b) is a cross-sectional view illustrating how electrons move during the erase operation.

First, the array structure of the drain-side FN—FN type flash EEPROM will be described with reference to FIG. 25(a). As shown in FIG. 25(a), each memory word line M.W-0, 1, 2 interconnects the control gate electrodes 107 of memory cells arranged on the same row in the direction X. Each source line S-0, 1, 2 interconnects the source diffusion layers 109 of memory cells arranged on the same row in the direction X. And each bit line B-0, 1, 2 interconnects the drain diffusion layers 108 of memory cells arranged on the same column in the direction Y.

In this manner, the source lines are disposed in parallel to the word lines for memory cells (i.e., the memory word lines) and the bit lines are disposed vertically to the memory word lines.

Next, an erasing method will be described. FIG. 25(a) illustrates the voltages applied for simultaneously erasing data from all of the nine memory cells illustrated. As shown in FIG. 25(a), a voltage of +7 V is applied to the memory word lines M.W-0, 1, 2 and a voltage of −7 V is applied to the P-type well PW. As a result, the potential difference between the control gate electrode 107 and the surface of the channel is 14 V at every memory transistor. Consequently, as shown in FIG. 25(b), tunneling current flows from the entire surface region of the channel into the floating gate electrode 105, whereby electrons are injected into the floating gate electrode 105. In this case, the threshold voltage of the memory transistor is about 4 V.

Next, a writing method will be described. FIG. 26(a) is an electric circuit diagram illustrating voltages applied for writing data into only one memory cell located at the center of the array and selected from the nine memory cells included in the drain-side FN—FN type flash EEPROM. And FIG. 26(b) is a cross-sectional view illustrating how electrons move during the write operation. As shown in FIG. 26(a), a voltage of −9 V is applied to the memory word line M.W-1 connected to the memory cell to which data is selectively written (i.e., a selected memory cell). And voltages of +5 V and 0 V are respectively applied to the bit line B-1 connected to the selected memory cell and to the P-type well (PW) 3. As a result, the potential difference between the control gate electrode 107 and the drain diffusion layer 108 is 14 V at the selected memory cell. Consequently, as shown in FIG. 26(b), tunneling current flows from the floating gate electrode 105 into the drain diffusion layer 108 and electrons are ejected out of the floating gate electrode 105. In this case, the threshold voltage of the memory transistor is about 1.2 V.

Also, in order to prevent the data from being erroneously written into non-selected memory cells, a voltage of 0 V is applied to the other memory word lines M.W-0, 2 and to the other bit lines B-0, 2. As a result, the potential difference between the control gate electrode 107 and the drain diffusion layer 108 can be no greater than 9 V at the non-selected memory cells and it is possible to prevent the data from being erroneously written into the non-selected memory cells.

Next, a reading method will be described. FIG. 27(a) is an electric circuit diagram illustrating voltages applied for reading data from only one memory cell located at the center and selected from the nine memory cells included in the drain-side FN—FN type flash EEPROM as a nonvolatile semiconductor memory device. And FIG. 27(b) is a cross-sectional view illustrating how electrons move during the read operation. As shown in FIG. 27(a), a voltage of 3 V is applied to the memory word line M.W-1 connected to a memory cell from which data is selectively read out (i.e., a selected memory cell). And voltages of 1 V and 0 V are respectively applied to the bit line B-1 connected to the selected memory cell and the P-type well PW. As a result, if the selected memory transistor is in a write state (VT=1.2 V), then the current flows as shown in FIG. 27(b). On the other hand, if the selected memory transistor is in an erase state (VT=4 V), then the current does not flow. Based on the current flow, the existence of data stored can be sensed.

The drain-side FN—FN type flash EEPROM has the following three problems.

The first problem concerns the unsatisfactory reliability thereof. In accordance with the method used by the drain-side FN—FN type flash EEPROM utilizing the tunneling current between the drain diffusion layer 108 and the floating gate electrode 105, a potential difference of about 5 V is required between the drain diffusion layer 108 and the P-type well 103. In addition, since a voltage of −9 V is applied to the control gate electrode 107, band-to-band tunneling current is generated between the drain diffusion layer 108 and the P-type well 103. As a result, holes are generated owing to the band-to-band tunneling current in the vicinity of a boundary region between the P-type well 103 and the drain diffusion layer 108, and are trapped in the gate insulating film 104. Consequently, the reliability is deteriorated.

The second problem pertains to the power consumed during writing. In the drain-side FN—FN type flash EEPROM utilizing the tunneling current flowing between the drain diffusion layer 108 and the floating gate electrode 105, the band-to-band tunneling current is generated as described above. Accordingly, write current of about 100 nA is required per cell.

And the third problem relates to the lower limit of the power supply voltage during reading. A memory cell of the drain-side FN—FN type flash EEPROM is constituted by only one memory transistor. Accordingly, if the variation in threshold voltages is to be controlled after the write operation has been performed, then a write depth (i.e., the threshold voltage) should be controlled on a bit-by-bit basis, which requires a too much complicated controller. Moreover, since the controllable variation of the threshold voltage is as small as about 0.8 V, the threshold voltages after the write operation has been performed are distributed in the range from about 0.8 V to about 1.6 V. Thus, in order not to cause erroneous reading, the power supply voltage cannot be less than about 2.5 V, even through the voltage is preferably further lower.

In order to solve these problems, a nonvolatile semiconductor memory device, in which a memory cell includes a sidewall-shaped select transistor, was proposed in U.S. Pat. No. 5,402,371, for example. Hereinafter, the nonvolatile semiconductor memory device and a method for driving the same will be described.

FIG. 28 is a cross-sectional view illustrating a memory cell structure for the nonvolatile semiconductor memory device. As shown in FIG. 28, a select transistor is formed as a sidewall on the side face of the floating gate electrode 105 and the control gate electrode 107, and includes a select gate electrode 113. A lateral interelectrode insulating film 112 is interposed between the select gate electrode 113 and the floating gate and control gate electrodes 105, 107. Also, a gate insulating film 111 is interposed between the select gate electrode 113 and the substrate.

In order to solve the three problems of the drain-side FN—FN type flash EEPROM, the memory cell shown in FIG. 28 uses the sidewall-shaped select gate electrode 113 made of polysilicon, thereby realizing a rewrite operation using the tunneling current flowing between the floating gate electrode 105 and the entire surface of the channel for both writing and erasing. In accordance with such a rewrite method, no potential difference is required between the drain diffusion layer 108 and the P-type well 103, and therefore no band-to-band tunneling current is generated. Accordingly, no holes resulting from the band-to-band tunneling current are generated. As a result, the reliability problem can be solved and the current consumed during rewriting can be reduced. Also, even when the threshold voltage of a memory transistor is negative, the threshold voltage of the memory cell may be determined by the threshold voltage of the select transistor additionally provided.

Such a rewrite method using the tunneling current flowing between the floating gate electrode 105 and the entire surface of the channel for both writing and erasing was also implemented by a NAND-type flash EEPROM. Also, it was already proved that this method is more advantageous in terms of reliability (i.e., the number of times satisfactory rewriting is ensured). In addition, this method enables a rewrite operation using a single power supply at a lower voltage. However, since the NAND-type flash EEPROM has an array structure of a NAND type, this flash EEPROM requires an adversely long random access time. On the other hand, the nonvolatile semiconductor memory device shown in FIG. 28 has an array structure of a NOR type, and therefore can effectively perform random access in a shorter time. However, the cell size of the NOR-type flash EEPROM is larger than that of the NAND-type flash EEPROM.

In sum, the nonvolatile semiconductor memory device shown in FIG. 28 has a NOR-type array structure enabling random access at a higher speed and realizes a rewrite operation using the tunneling current between the floating gate electrode 105 and the entire surface of the channel for both writing and erasing. Hereinafter, the array structure of the conventional nonvolatile semiconductor memory device shown in FIG. 28 and a method for driving the same will be described.

FIG. 29(a) is an electric circuit diagram illustrating voltages applied for simultaneously erasing data from all the memory cells, each including the sidewall-shaped select transistor of the conventional nonvolatile semiconductor memory device as shown in FIG. 28. And FIG. 29(b) is a cross-sectional view illustrating how electrons move during the erase operation.

First, the array structure of the nonvolatile semiconductor memory device will be described. As shown in FIG. 29(a), each memory word line M.W-0, 1, 2 interconnects the control gate electrodes 107 of memory cells arranged on the same row in the direction X. Each select word line S.W-0, 1, 2 interconnects the select gate electrodes 113 of memory cells arranged on the same row in the direction X. Each source line S-0, 1, 2 interconnects the source diffusion layers 109 of memory cells arranged on the same row in the direction X. And each bit line B-0, 1, 2 interconnects the drain diffusion layers 108 of memory cells arranged on the same column in the direction Y. In this manner, the source lines are disposed in parallel to the word lines for memory cells (i.e., the memory word lines and the select word lines) and the bit lines are disposed vertically to the word lines.

Next, an erasing method will be described. FIG. 29(a) illustrates the voltages applied for simultaneously erasing data from all of the nine memory cells illustrated. As shown in FIG. 29(a), a voltage of −7 V is applied to the memory word lines M.W-0, 1 and 2 and a voltage of +7 V is applied to the P-type well PW. As a result, the potential difference between the control gate electrode 107 and the surface of the channel is 14 V at every memory transistor. Accordingly, as shown in FIG. 29(b), tunneling current flows from the floating gate electrode 105 into the entire surface region of the channel, whereby electrons are ejected out of the floating gate electrode 105. In this case, the threshold voltage of the memory transistor is about −1 V. Since each memory cell is a serial connection of a select transistor (VT=0.6 V) and a memory transistor (VT=−1 V), the threshold voltage of each memory cell is 0.6 V.

Next, a writing method will be described. FIG. 30(a) is an electric circuit diagram illustrating voltages applied for writing data into only one memory cell located at the center and selected from the nine memory cells, each including the sidewall-shaped select transistor of the nonvolatile semiconductor memory device as shown in FIG. 28. And FIG. 30(b) is a cross-sectional view illustrating how electrons move during the write operation. As shown in FIG. 30(a), a voltage of +9 V is applied to the memory word line M.W-1 connected to a memory cell to which data is selectively written (i.e., a selected memory cell). And a voltage of −5 V is applied to the select word line S.W-1 and the bit line B-1 that are connected to the selected memory cell and to the P-type well PW. As a result, the potential difference between the control gate electrode 107 and the surface region of the channel is 14 V at the selected memory transistor. Accordingly, as shown in FIG. 30(b), tunneling current flows from the entire surface region of the channel into the floating gate electrode 105, whereby electrons are injected into the floating gate electrode 105. In this case, the threshold voltage of the memory transistor is about 4 V. Since each memory cell is a serial connection of a select transistor (VT=0.6 V) and a memory transistor (VT=4 V), the threshold voltage of each memory cell is 4 V.

Also, in order to prevent the data from being erroneously written into non-selected memory cells, a voltage of −5 V is applied to the other memory word lines M.W-0, 2 and select word lines S.W-0, 2, and a voltage of 0 V is applied to the other bit lines B-0, 2. As a result, the potential difference between the control gate electrode 107 and the surface region of the channel can be no greater than 9 V at the non-selected memory cells and it is possible to prevent the data from being erroneously written into the non-selected memory cells. In this case, a voltage of −5 V is applied to all the select word lines S.W-0, 1, 2, because all the select transistors should be turned OFF. For example, if a voltage of 0 V is applied to the select word line S.W-1 connected to the selected memory cell, the select transistor of the memory cell is turned ON. Then, the voltage of −5 V, applied to the selected bit line B-1, is unintentionally transmitted through the source line S-1 to the non-selected memory cells connected in common with the selected memory cell in the direction Y. As a result, erroneous writing is caused.

Next, a reading method will be described. FIG. 31(a) is an electric circuit diagram illustrating voltages applied for reading data from only one memory cell located at the center and selected from the nine memory cells, each including the sidewall-shaped select transistor of the nonvolatile semiconductor memory device as shown in FIG. 28. And FIG. 31(b) is a cross-sectional view illustrating how electrons move during the read operation. As shown in FIG. 31(a), a voltage of 3 V is applied to the memory word line M.W-1 connected to the memory cell from which data is selectively read out (i.e., a selected memory cell). And voltages of 3 V, 1 V and 0 V are respectively applied to the select word line S.W-1 and the bit line B-1 that are connected to the selected memory cell and to the P-type well PW. As a result, if the selected memory transistor is in an erase state (VT=0.6 V), then electrons move from the source diffusion layer 109 toward the drain diffusion layer 108 and the current flows as shown in FIG. 31(b). On the other hand, if the selected memory transistor is in a write state (VT=4 V), then the current does not flow. Based on the current flow, the existence of data stored can be sensed.

The nonvolatile semiconductor memory device shown in FIG. 28 and the method for driving the same have the following three advantages over the drain-side FN—FN type flash EEPROM shown in FIG. 24.

The first advantage lies in the improvement of reliability. In accordance with the method used by the drain-side FN—FN type flash EEPROM shown in FIG. 24 utilizing the tunneling current between the drain diffusion layer 108 and the floating gate electrode 105 for writing, a potential difference of about 5 V is required between the drain diffusion layer 108 and the P-type well 103. In addition, since a voltage of −9 V is applied to the control gate electrode 107, band-to-band tunneling current is generated. As a result, holes are generated owing to the band-to-band tunneling current and trapped in the gate insulating film 104. Consequently, the reliability is deteriorated. By contrast, the flash EEPROM shown in FIG. 28 including the sidewall-shaped select gate electrode uses the tunneling current flowing between the floating gate electrode 105 and the entire surface region of the channel of the memory transistor for both writing and erasing. Accordingly, no potential difference is generated between the drain diffusion layer 108 and the P-type well 103 and no band-to-band tunneling current is generated. Thus, since almost no holes are generated, the deterioration of reliability can be suppressed.

The second advantage pertains to the reduction of power consumed during writing and erasing. In the drain-side FN—FN type flash EEPROM shown in FIG. 24 utilizing the tunneling current flowing between the drain diffusion layer 108 and the floating gate electrode 105 of the memory transistor, the band-to-band tunneling current is generated as described above. Accordingly, write current of about 100 nA is required per memory cell. On the other hand, in the flash EEPROM shown in FIG. 28, no band-to-band tunneling current is generated during either writing or erasing. Thus, write current of only 1 nA or less is required per memory cell. That is to say, the flash EEPROM shown in FIG. 28 can operate while consuming one-hundredth or less power compared with the drain-side FN—FN type flash EEPROM. As a result, the area occupied by an internal voltage step-up circuit can be reduced. Alternatively, since the number of bits, to which data can be written simultaneously, increases, a write time can be decreased or a rewrite operation can be performed at an even lower voltage.

And the third advantage relates to the lower limit of the power supply voltage during reading. A memory cell of the drain-side FN—FN type flash EEPROM is constituted by only one memory transistor. Accordingly, if the variation in threshold voltages is to be controlled after the write operation has been performed, then a write depth (i.e., the threshold voltage) should be controlled on a bit-by-bit basis, which requires a too much complicated controller. Moreover, since the controllable variation of the threshold voltages is as small as about 0.8 V, the threshold voltages after the write operation has been performed are distributed within a range from about 0.8 V to about 1.6 V. Thus, in order not to cause erroneous reading, the power supply voltage cannot be less than about 2.5 V, even through the voltage is preferably further lower. By contrast, in the flash EEPROM shown in FIG. 28, a memory cell has a serial connection of two transistors, i.e., select transistor and memory transistor. Accordingly, even when the threshold voltage of the memory transistor is negative, the threshold voltage of the memory cell is no lower than the threshold voltage of the select transistor. Thus, the threshold voltage of the memory cell can be set somewhere between about 0.6 V and about 0.8 V. By narrowing the voltage range in this manner, reading can be performed at as low as about 1.5 V, for example.

However, in the flash EEPROM shown in FIG. 28, the area occupied by a memory cell increases. In the drain-side FN—FN type flash EEPROM, a memory cell is constituted by a single memory transistor. On the other hand, since the memory cell structure of the flash EEPROM shown in FIG. 28 requires a select transistor to operate, the area occupied by a memory cell increases for that part. Nevertheless, by using the sidewall-shaped select transistor, the increase of the area occupied by a single memory cell is less large than the case of additionally providing a select transistor for the drain-side FN—FN type flash EEPROM.

Therefore, the nonvolatile semiconductor memory device shown in FIG. 28 and a method for driving the same can be regarded as having the above described three advantages over the drain-side FN—FN type flash EEPROM. However, in actually implementing the device and the method, the following two problems are likely to be caused.

The first problem concerns the reliability of the lateral interelectrode insulating film 112 formed between the select gate electrode and the control gate electrode.

During the write operation shown in FIGS. 30(a) and 30(b), when voltages of 9 V and −5 V are respectively applied to the memory word line M.W-1 and the select word line S.W-1 connected to the selected memory cell, a potential difference of 14 V (i.e., 5+9 V) is generated in the lateral interelectrode insulating film 112 between the control gate electrode 107 and the select gate electrode 113. However, in order to carry out the fabrication process thereof efficiently, the lateral interelectrode insulating film 112 and the gate insulating film 111 of the select transistor should be formed during the same process step. On the other hand, the lateral thickness (i.e., the gate length) of the select gate electrode 113 shaped like a sidewall cannot be too large and at most about 0.2 µm in view of the process efficiency. Accordingly, the thickness of the gate insulating film 111 of the select transistor should be about 4 nm or more to make the select transistor exert its originally intended function. Thus, the thickness of the lateral interelectrode insulating film 112 is at most about 10 nm even when the effect of accelerated oxidation of polysilicon is taken into consideration. That is to say, since a potential difference of 14 V is generated in the lateral interelectrode insulating film 112 having a thickness as small as 10 nm during writing, insulation breakdown possibly happens to deteriorate the reliability.

The second problem relates to the source-to-drain breakdown voltage of the select transistor including the select gate electrode 113.

During writing, the drain diffusion layer 108 of the select transistor in each of the non-selected memory cells connected in common with the selected memory cell to the same word line has a potential of about 0 V. And the source diffusion layer 109 thereof has a potential of about −5 V. Though the source line is open, the potential of the source diffusion layer 109 is substantially equal to that of the P-type well. As a result, a potential difference of about 5 V is generated between the drain diffusion layer 108 and the source diffusion layer 109. However, considering that the gate length of the select gate electrode 113 is at most about 0.2 µm, the source-to-drain breakdown voltage of the select transistor is at most about 2.5 V, which is far lower than 5 V. Accordingly, during writing, since the select transistors of the non-selected memory cells are not turned OFF, erroneous writing possibly happens.

The conventional nonvolatile semiconductor memory device shown in FIG. 28 and the method for driving the same have these problems, and therefore it is doubtful whether the device and the method can be implemented satisfactorily.

SUMMARY OF THE INVENTION

The object of the present invention is to provide a nonvolatile semiconductor memory device functioning as a flash EEPROM, in which a memory cell includes a memory transistor and a select transistor, and a method for driving the same. Specifically, the device of the present invention is configured to prevent the lateral interelectrode insulating film between the select transistor and the memory transistor from being deteriorated and to suppress erroneous writing resulting from an insufficient source-to-drain breakdown voltage of the select transistor.

The present invention takes the measures of: using an independent transistor, not a sidewall-shaped transistor, as the select transistor; disposing electrically independent source lines in parallel to or vertically to respective bit lines (i.e., vertically to or in parallel to respective word lines); and providing a plurality of electrically independent well regions for the respective bit lines.

A first nonvolatile semiconductor memory device according to the present invention has an array of memory cells arranged in columns and rows over a well region of a semiconductor substrate. Each of the memory cells includes a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film. Each memory cell further includes: a select transistor including a second gate insulating film formed on the semiconductor substrate and a select gate electrode formed on the second gate insulating film, the select transistor being disposed on the semiconductor substrate to be spaced apart from the memory transistor; an intermediate diffusion layer formed in a region of the semiconductor substrate and located between the memory transistor and the select transistor; and source/drain diffusion layers formed in the semiconductor substrate to interpose a region underlying the memory transistor, a region underlying the select transistor and the intermediate diffusion layer therebetween.

Since the first device of the present invention has such a structure as preventing band-to-band tunneling current from being generated, the reliability can be improved and the power consumption during writing and erasing can be reduced. In addition, since this device includes a select transistor, the threshold voltage of a memory cell can be defined by the stable threshold voltage of the select transistor. Accordingly, the power supply voltage may be low during reading. Moreover, the memory transistor and the select transistor are provided to be spaced apart from each other. Thus, unlike a conventional nonvolatile semiconductor memory device where a memory cell includes a sidewall-shaped select gate electrode, the deterioration in reliability of a lateral interelectrode insulating film is not an issue in this device of the present invention. Furthermore, the gate length of the select gate electrode of the select transistor can be set at a sufficiently large value. Accordingly, the breakdown voltage of the select transistor is no longer insufficient. Consequently, a nonvolatile semiconductor memory device, exhibiting excellent characteristics and having an easily implementable structure, is realized.

In one embodiment of the present invention, the select transistor may be disposed between the source diffusion layer and the intermediate diffusion layer, while the memory transistor may be disposed between the drain diffusion layer and the intermediate diffusion layer. And the first device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same row and associated with the source line; and a plurality of bit lines, each said bit line interconnecting the drain diffusion layers of the memory cells arranged on the same column and associated with the bit line.

In an alternate embodiment, the select transistor is preferably disposed between the source diffusion layer and the intermediate diffusion layer, while the memory transistor is preferably disposed between the drain diffusion layer and the intermediate diffusion layer. And the first device preferably further includes: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

In such an embodiment, the source lines extend in parallel to the bit lines (i.e., along the columns) and are provided electrically independently from each other for the respective bit lines. Accordingly, in this structure, no leakage current is generated between bit lines through a source line. As a result, not only the above effects are attained, but also erroneous writing can be prevented without fail while electrons are injected into the floating gate electrode of the memory transistor. Moreover, the circuit size of a decoder controlling a select word line can be reduced and a high-speed operation is realized.

In another embodiment of the present invention, the select transistor may be disposed between the drain diffusion layer and the intermediate diffusion layer, while the memory transistor may be disposed between the source diffusion layer and the intermediate diffusion layer. And the first device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

In such an embodiment, since the source lines extend in parallel to the bit lines (i.e., along the columns) and are provided electrically independently for the respective bit lines, the effects described above can be attained. In addition, since the configuration of a bit line driver including a read circuit can be simplified, this structure is advantageous to a high-speed read operation.

In still another embodiment, the well region is divided into a plurality of electrically isolated regions corresponding to the respective columns.

In such an embodiment, the potential in each well region can be controlled on a bit line basis. Thus, the potential difference between a source or drain diffusion layer and an associated well region can be 0 V and no breakdown voltage needs to be secured for this part. As a result, the reliability can be further improved.

In still another embodiment, the select transistor may be disposed between the source diffusion layer and the intermediate diffusion layer, while the memory transistor may be disposed between the drain diffusion layer and the intermediate diffusion layer. And the first device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

In an alternate embodiment, the select transistor is preferably disposed between the drain diffusion layer and the intermediate diffusion layer, while the memory transistor is preferably disposed between the source diffusion layer and the intermediate diffusion layer. And the first device preferably further includes: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

In such an embodiment, the source lines are provided in parallel to the bit lines and electrically independently from each other for the respective bit lines. Accordingly, in this structure, no leakage current is generated between bit lines through a source line. As a result, erroneous writing can be prevented without fail while electrons are injected into the floating gate electrode of the memory transistor.

In still another embodiment, the first device may further include a circuit for controlling a potential in each said select word line, the circuit being a high-power transistor optimized to operate at about a power supply voltage such that the potential in the select word line is variable in the range from a ground potential to the power supply voltage.

In such an embodiment, the circuit size of a decoder can be reduced and a high-speed read operation is realized.

In still another embodiment, the first device may further include a circuit for controlling a potential in each said bit line, the circuit being a high-power transistor optimized to operate at about a power supply voltage such that the potential in the bit line is variable in the range from a ground potential to the power supply voltage.

In still another embodiment, the second gate insulating film of the select transistor and the first gate insulating film of the memory transistor are formed at the same thickness during the same process step such that a potential difference between the select gate electrode of the select transistor and the well region causes an electric field of 5 MV/cm or less to be applied to the second gate insulating film.

In such an embodiment, the thickness of the second gate insulating film may be adjusted at such a value as limiting the voltage applied thereto to 5 V or less, while the thickness of the first gate insulating film may be adjusted at such a value as allowing electrons to be tunneled.

A second nonvolatile semiconductor memory device according to the present invention has an array of memory cells arranged in columns and rows over a well region of a semiconductor substrate. Each memory cell includes a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film. Each memory cell further includes source/drain diffusion layers formed in the semiconductor substrate to interpose a region underlying the memory transistor therebetween. The well region is divided into a plurality of electrically isolated regions corresponding to the respective columns.

Since the second device has a structure making the potential in a well region controllable on a bit line basis, the potential difference between a source or drain diffusion layer and an associated well region can be 0 V and no breakdown voltage needs to be secured for this part. As a result, satisfactory reliability can be ensured without providing a select transistor, and therefore the device size can be further miniaturized while attaining the above effects.

In one embodiment of the present invention, the second device preferably further includes: a plurality of memory word lines, each said memory word line interconnecting the control gate electrodes of the respective memory transistors in the memory cells arranged on the same row and associated with the memory word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

In another embodiment of the present invention, the first or second device may further include: a plurality of laterally isolating regions, formed along the columns and between the respective well regions and made of a semiconductor or an insulator of an opposite conductivity type to that of the well regions, for laterally isolating the respective well regions from each other; and a plurality of vertically isolating regions, each said vertically isolating region being interposed between an associated one of the well regions and the semiconductor substrate and made of a semiconductor or an insulator of the opposite conductivity type to that of the well regions.

In such an embodiment, the well regions can be electrically isolated from each other for the respective columns with more certainty.

A first method for driving a nonvolatile semiconductor memory device according to the present invention is a method for driving the first nonvolatile semiconductor memory device. In accordance with this method, tunneling current, allowing electrons to pass through the first gate insulating film of the memory transistor, is used while the electrons are ejected out of the floating gate electrode and while the electrons are injected into the floating gate electrode.

In accordance with this method, a nonvolatile semiconductor memory device, having such a structure as preventing the deterioration in reliability of the lateral interelectrode insulating film and the shortage of a breakdown voltage unlike a conventional nonvolatile semiconductor memory device, is driven so as to prevent band-to-band tunneling current from being generated. Accordingly, write and erase operations can be performed with low power consumption while suppressing the deterioration in characteristics of the nonvolatile semiconductor memory device.

In one embodiment of the present invention, an erase operation is performed by applying a ground potential or a first negative voltage to the control gate electrode of the memory transistor and a second voltage, higher than the first voltage, to the well region and thereby ejecting electrons out of the floating gate electrode of the memory transistor.

In such an embodiment, tunneling current flows through the entire surface of the first gate insulating film and electrons move from the floating gate electrode toward the well region. As a result, the band-to-band tunneling current is not generated, and therefore an erase operation can be performed with low power consumption and without deteriorating the reliability.

In another embodiment of the present invention, a threshold voltage of the memory transistor is negative after the erase operation has been performed.

In such an embodiment, if the threshold voltage of the select transistor is set at a relatively low positive voltage, the threshold voltage of a memory cell can be easily defined by the threshold voltage of the select transistor, even through the threshold voltage of the memory transistor is variable. Accordingly, a read operation can be performed at a low voltage.

In still another embodiment, the select transistor may be disposed between the source diffusion layer and the intermediate diffusion layer, while the memory transistor may be disposed between the drain diffusion layer and the intermediate diffusion layer. And the device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same row or the same column and associated with the source line; and a plurality of bit lines, each said bit line interconnecting the drain diffusion layers of the memory cells arranged on the same column and associated with the bit line. Then, a write operation may be performed by applying: a first positive voltage to the control gate electrode of one of the memory transistors, to which transistor data is written; a second voltage, lower than the first voltage, to the control gate electrodes of the other memory transistors, to which the data is not written; a third voltage, lower than the first voltage, to the well region; a fourth voltage, equal to or higher than the third voltage, to the bit line connected to the memory transistor, to which the data is written; and a fifth voltage, higher than the fourth voltage, to the bit lines connected to the memory transistors, to which the data is not written, and thereby selectively injecting electrons into the floating gate electrode of the memory transistor, to which the data is written.

In such an embodiment, by controlling the voltages of the drain diffusion layer and the well region in the vicinity of the memory transistor during writing, the voltage applied to the first gate insulating film of the memory transistors in the non-selected memory cells can be smaller than the voltage applied to the first gate insulating film of the memory transistor in the selected memory cell. As a result, erroneous writing can be prevented with more certainty.

In still another embodiment, the select transistor may be disposed between the drain diffusion layer and the intermediate diffusion layer, while the memory transistor may be disposed between the source diffusion layer and the intermediate diffusion layer. And the device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line. Then, a write operation may be performed by applying: a first positive voltage to the control gate electrode of one of the memory transistors, to which transistor data is written; a second voltage, lower than the first voltage, to the control gate electrodes of the other memory transistors, to which the data is not written; a third voltage, lower than the first voltage, to the well region; a fourth voltage, equal to or higher than the third voltage, to the source line connected to the memory transistor, to which the data is written; and a fifth voltage, higher than the fourth voltage, to the source lines connected to the memory transistors, to which the data is not written, and thereby selectively injecting electrons into the floating gate electrode of the memory transistor, to which the data is written.

In such an embodiment, by controlling the voltages of the source diffusion layer and the well region in the vicinity of the memory transistor during writing, the voltage applied to the first gate insulating film of the memory transistors in the non-selected memory cells can be smaller than the voltage applied to the first gate insulating film of the memory transistor in the selected memory cell. As a result, erroneous writing can be prevented with more certainty. In addition, since erroneous writing can be prevented without the application of a negative voltage to the bit line of the selected memory cell, simplified control is realized during writing.

In still another embodiment, the well region may be divided into a plurality of electrically isolated regions corresponding to the respective columns. And the device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line. Then, a write operation may be performed by applying: a first positive voltage to the control gate electrode of one of the memory transistors, to which transistor data is written; a second voltage, lower than the first voltage, to the control gate electrodes of the other memory transistors, to which the data is not written; a third voltage, lower than the first voltage, to the well region where the memory transistor, to which the data is written, is located; and a fourth voltage, higher than the third voltage, to the well regions where the memory transistors, to which the data is not written, are located, and thereby selectively injecting electrons into the floating gate electrode of the memory transistor, to which the data is written.

In such an embodiment, by independently controlling the respective potentials in the well regions that are electrically isolated from each other for the respective columns, the potential difference between a source or drain diffusion layer of a memory cell and an associated well region can be substantially eliminated. Accordingly, since no breakdown voltage should be secured, the structure can be simplified.

In still another embodiment, each said source line may interconnect the respective source diffusion layers of the memory cells arranged on the same row and associated with the source line, and the third voltage, applied to the well region, is applied to the select gate electrodes of the select transistors associated with the write operation such that the select transistors are turned OFF.

In such an embodiment, even when the breakdown voltage of a select transistor is low, erroneous writing can be prevented with much more certainty.

In still another embodiment, a threshold voltage of the memory transistor is equal to or higher than a ground potential after the write operation has been performed.

In such an embodiment, a control voltage can be set relatively high during reading. Accordingly, erroneous reading resulting from the unintended activation of the memory transistors in the non-selected memory cells can be prevented.

In still another embodiment, the device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line. Then, the device may be driven such that a potential in each said select word line is variable between a ground potential and a power supply voltage during erase, write and read operations.

In such an embodiment, a decoder for controlling a select word line may be a very small transistor having a breakdown voltage as low as a power supply voltage. As a result, the circuit area of the decoder used for controlling a select word line can be reduced and a high-speed operation is realized.

In still another embodiment, the device may further include: a plurality of memory word lines, each said memory word line interconnecting the control gate electrodes of the respective memory transistors in the memory cells arranged on the same row and associated with the memory word line; a plurality of select word lines, each said select word line interconnecting the select gate electrodes of the respective select transistors in the memory cells arranged on the same row and associated with the select word line; a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line. Then, the device may be driven such that a potential in each said bit line is variable between a ground potential and a power supply voltage during erase, write and read operations.

In such an embodiment, a decoder for controlling a bit line may be a very small transistor having a breakdown voltage as low as a power supply voltage. As a result, the circuit area of the decoder used for controlling a bit line can be reduced and a high-speed operation is realized.

In still another embodiment, the device may be driven such that a potential difference between the select gate electrode of each said select transistor and the well region causes an electric field of 5 MV/cm or less to be applied to the second gate insulating film during erase, write and read operations.

In such an embodiment, since the voltage applied to the second gate insulating film can be reduced, a method for driving a nonvolatile semiconductor memory device is realized without deteriorating the reliability thereof owing to the deterioration of the second gate insulating film.

A second method for driving a nonvolatile semiconductor memory device according to the present invention is a method for driving the second nonvolatile semiconductor memory device. In accordance with this method, tunneling current, allowing electrons to pass through the first gate insulating film of the memory transistor, is used while the electrons are ejected out of the floating gate electrode and while 'the electrons are injected into the floating gate electrode.

In accordance with this method, a nonvolatile semiconductor memory device, having such a structure as preventing the deterioration in reliability of the lateral interelectrode insulating film and the shortage of a breakdown voltage without using a select transistor unlike a conventional nonvolatile semiconductor memory device, is driven so as to prevent band-to-band tunneling current from being generated. Accordingly, write and erase operations can be performed with low power consumption while suppressing the deterioration in characteristics of the nonvolatile semiconductor memory device.

In one embodiment of the present invention, an erase operation may be performed by applying a first positive voltage to the control gate electrode of the memory transistor and a second voltage, lower than the first voltage, to the well region and thereby injecting the electrons into the floating gate electrode of the memory transistor.

In such an embodiment, unlike the case an erase operation is performed by ejecting electrons out of the floating gate electrode, excessive erasure does not happen. Accordingly, erroneous reading can be prevented with the variation in threshold voltages of a memory transistor suppressed.

In another embodiment, a threshold voltage of the memory transistor is preferably equal to or higher than a ground potential after the erase operation has been performed.

In such an embodiment, erroneous reading, resulting from the unintended activation of memory cells in erase state, can be prevented during a read operation.

In still another embodiment, each said memory cell may further include: a select transistor including a second gate insulating film formed on the semiconductor substrate and a select gate electrode formed on the second gate insulating film, the select transistor being disposed on the semiconductor substrate to be spaced apart from the memory transistor; and an intermediate diffusion layer formed in a region of the semiconductor substrate and located between the memory transistor and the select transistor.

If each said memory cell includes only the memory transistor, then a threshold voltage of the memory transistor is preferably equal to or higher than a power supply voltage after the erase operation has been performed.

In such a case, while the memory transistor of a selected memory cell, from which data is read out, is in erase state, the memory cell is not activated. Accordingly, erroneous reading can be prevented with more certainty.

In still another embodiment, a write operation may be performed by applying: a ground potential or a first negative voltage to the control gate electrode of one of the memory transistors, to which transistor data is written; a second voltage, higher than the first voltage, to the control gate electrodes of the other memory transistors, to which the data is not written; a third voltage, higher than the first voltage, to the well region where the memory transistor, to which the data is written, is located; and a fourth voltage, lower than the third voltage, to the well regions where the memory transistors, to which the data is not written, are located and thereby selectively ejecting electrons out of the floating gate electrode of the memory transistor, to which the data is written.

In such an embodiment, the threshold voltage can be in a controllable write state on a bit-by-bit basis. Unlike the case an erase operation is performed by ejecting electrons out of the floating gate electrode, the variation in threshold voltages resulting from excessive erasure can be prevented. Accordingly, the variation in threshold voltages of a memory transistor, to which data is written, can be suppressed and erroneous reading can be prevented with more certainty.

In still another embodiment, a threshold voltage of the memory transistor is negative after the write operation has been performed.

In such an embodiment, the threshold voltage of a memory cell in write state is clearly different from the threshold voltage of a memory cell in erase state. Accordingly, erroneous reading can be prevented.

If each said memory cell includes only the memory transistor, a threshold voltage of the memory transistor is preferably in the range from a ground potential to a power supply voltage after the write operation has been performed.

In still another embodiment, a constant potential, close to a ground potential, is preferably established in the control gate electrodes and the well regions of the memory transistors in selected ones of the memory cells, from which data is read out, and a potential in the select gate electrodes of the select transistors in selected ones of the memory cells is preferably set in the range from a threshold voltage of the select transistors to the power supply voltage.

In such an embodiment, a read operation is performed by setting a potential in a memory word line, which is activated with a delay because of the complicated configuration of a decoder, at a constant value in both the selected memory cell and the non-selected memory cells and controlling a potential in a select word line with a decoder having a simpler configuration. Accordingly, reading can be performed at a high speed.

In still another embodiment, a potential in the control gate electrodes of the memory transistors in selected ones of the memory cells, from which data is read out, is set at the power supply voltage.

In such an embodiment, the power supply voltage may be lower.

BRIEF DESCRIPTION OF THE DRAWINGS

FIG. 4($b$) is a cross-sectional view illustrating how electrons move during the erase operation.

FIG. 5($b$) is a cross-sectional view illustrating how electrons move during the write operation.

FIG. 6($b$) is a cross-sectional view illustrating how electrons move during the read operation.

FIG. 10($b$) is a cross-sectional view illustrating how electrons move during the erase operation.

FIG. 11($b$) is a cross-sectional view illustrating how electrons move during the write operation.

FIG. 12($b$) is a cross-sectional view illustrating how electrons move during the read operation.

DESCRIPTION OF THE PREFERRED EMBODIMENTS

Embodiment 1

Hereinafter, the first embodiment of the present invention will be described. In this embodiment, not a sidewall-shaped transistor, but a transistor independently formed is used as a select transistor.

Figure 1:
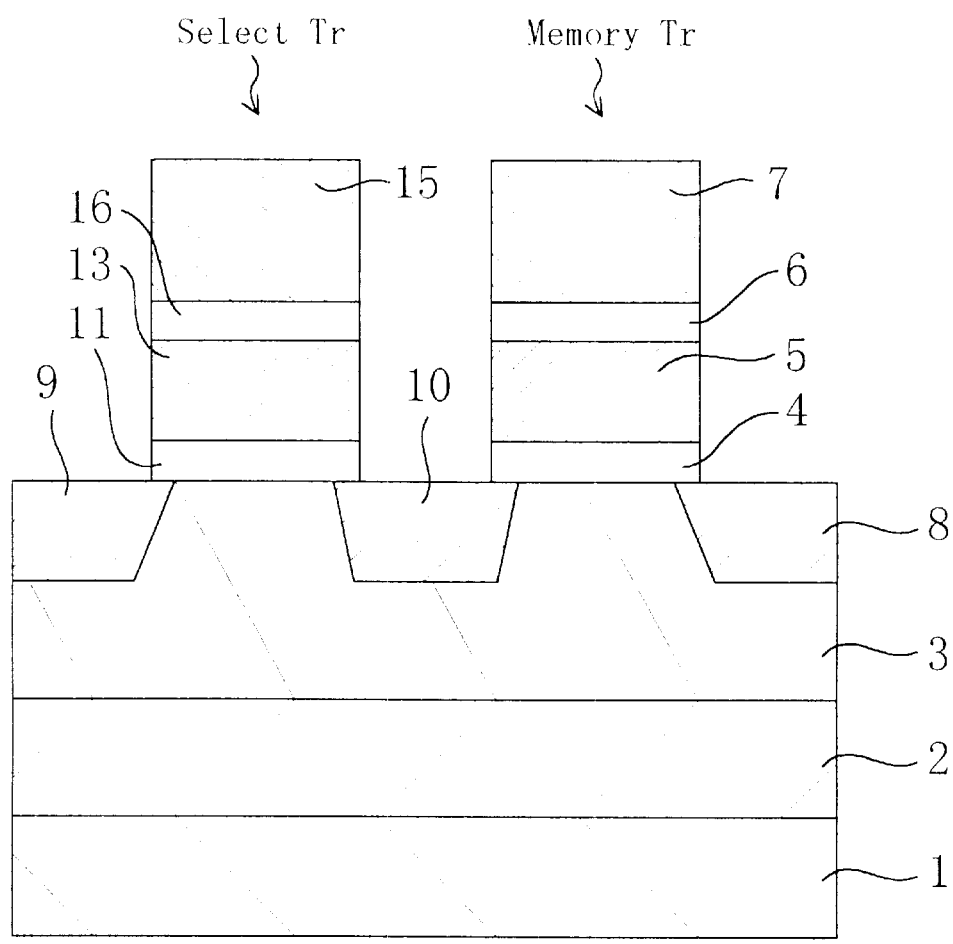
FIG. 1 is a cross-sectional view illustrating the structure of a memory cell taken in a direction Y in a nonvolatile semiconductor memory device of the first embodiment.
Figure 4A:
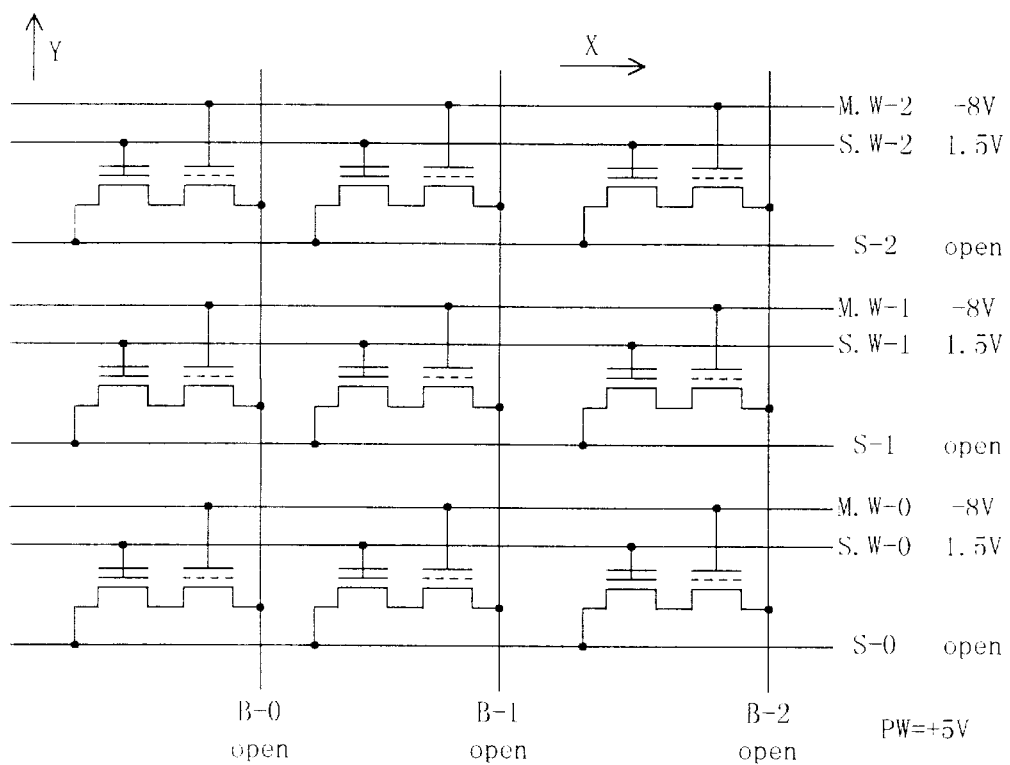
FIG. 4($a$) is an electric circuit diagram illustrating voltages applied for simultaneously erasing data from all the memory cells in the nonvolatile semiconductor memory device of the first embodiment.

FIG. 1 is a cross-sectional view illustrating the structure of a memory cell taken in the direction Y (i.e., a cross section including a gate longitudinal direction, see FIG. 4(a)) in a nonvolatile semiconductor memory device of the first embodiment. In FIG. 4(a), a memory transistor and a select transistor, which are disposed in a single memory cell, are apparently arranged side by side horizontally (i.e., in the direction X). However, memory word lines M.W parallel to the control gate electrodes of memory transistors and select word lines S.W parallel to the select gate electrodes of select transistors also extend horizontally in FIG. 4(a). Thus, it can be understood that, in actuality, the memory transistors and select transistors are arranged side by side vertically in FIG. 4(a) (i.e., in the direction Y). As shown in FIG. 1, the memory cell includes: a P-type semiconductor substrate 1; a deep N-type well 2; a P-type well 3; a memory transistor; a select transistor; a drain diffusion layer 8; a source diffusion layer 9; and an intermediate diffusion layer 10 formed in the substrate 1 between the memory transistor and the select transistor. The memory transistor includes: a gate insulating film 4; a floating gate electrode made of a first polysilicon film; an interelectrode insulating film 6; and a control gate electrode 7 made of a second polysilicon film. The select transistor includes: a gate insulating film 11; a select gate electrode 13 made of the first polysilicon film; an interelectrode insulating film 16; and a dummy electrode 15 made of the second polysilicon film. The select gate electrode 13 and the dummy electrode 15 are short-circuited at a site not shown, and the select transistor functions as a general MOS transistor.

As shown in FIG. 1, the memory cell of the nonvolatile semiconductor memory device of the first embodiment is made up of the memory transistor Memory Tr of an ordinary stacked gate type on the right-hand side of FIG. 1, and the select transistor Select Tr on the left-hand side of FIG. 1. The drain diffusion layer 8 is provided adjacent to the memory transistor, the source diffusion layer 9 is provided adjacent to the select transistor, and the intermediate diffusion layer 10 is provided between the memory transistor and the select transistor.

In FIG. 1, the floating gate electrode 5 of the memory transistor and the select gate electrode 13 of the select transistor are formed out of the same first polysilicon film, and the control gate electrode 7 of the memory transistor and the dummy electrode 15 of the select transistor are formed out of the same second polysilicon film. However, the present invention is not always limited to such an embodiment. For example, an ordinary single-layer polysilicon gate structure including only the select gate electrode 13 may be used by eliminating the dummy electrode 15 from the select transistor. Nevertheless, in the structure employed in this embodiment, each pair of gate electrodes can be shaped during a common process step. Accordingly, the resulting size of a memory cell can be smaller.

Figure 24:
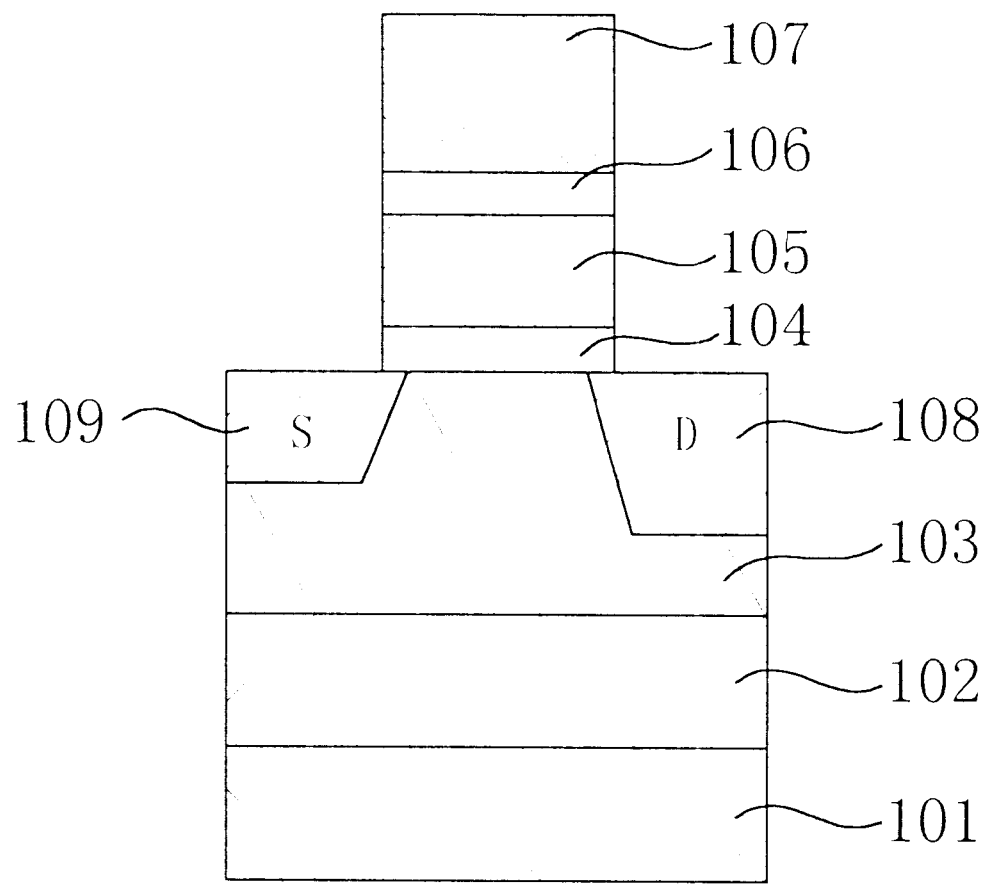
FIG. 24 is a cross-sectional view illustrating an exemplary memory cell structure for a conventional drain-side FN—FN type flash EEPROM.
Figure 25A:
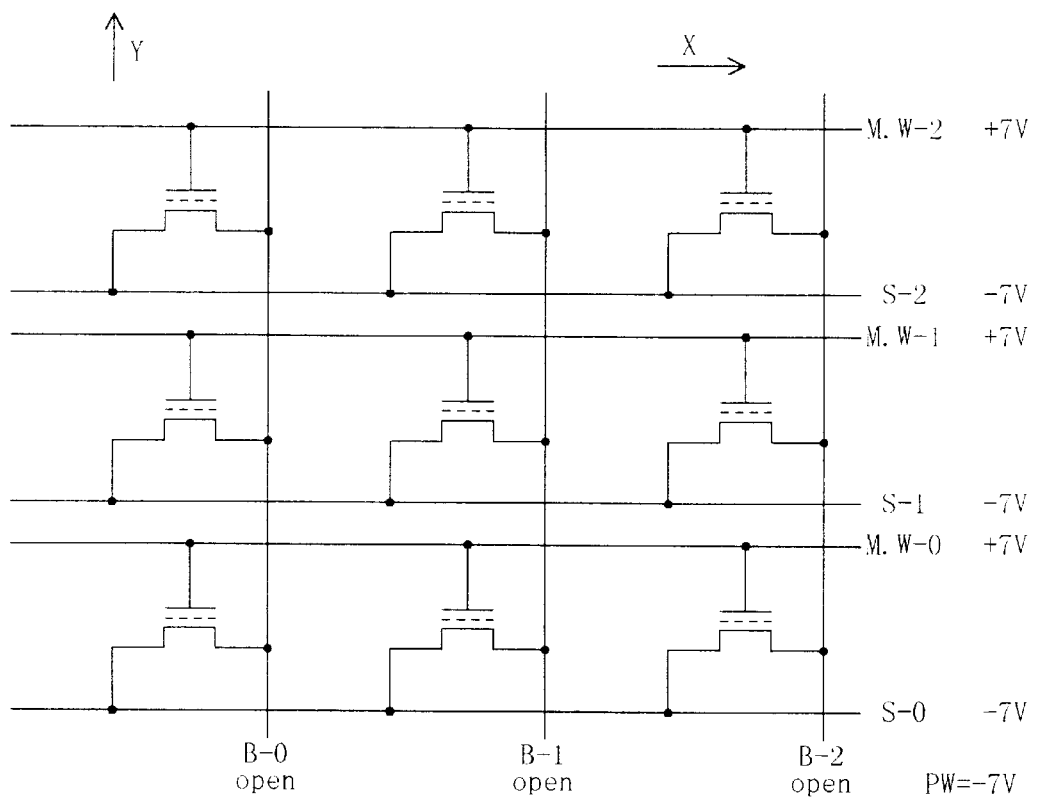
FIG. 25(a) is an electric circuit diagram illustrating voltages applied for simultaneously erasing data from all the memory cells in the conventional drain-side FN—FN type flash EEPROM.
Figure 25B:
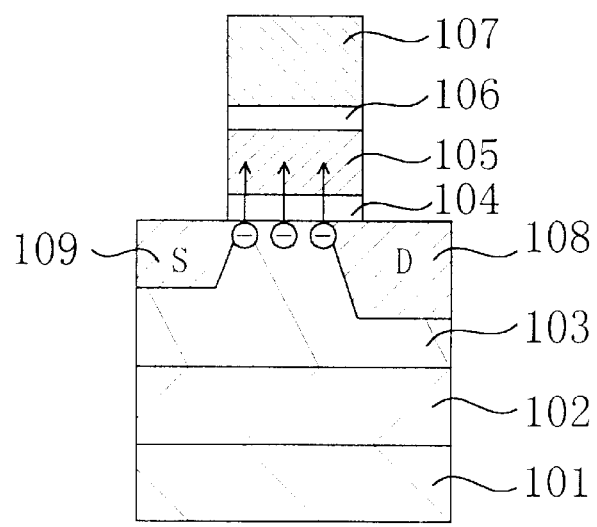
FIG. 25(b) is a cross-sectional view illustrating how electrons move during the erase operation.
Figure 26A:
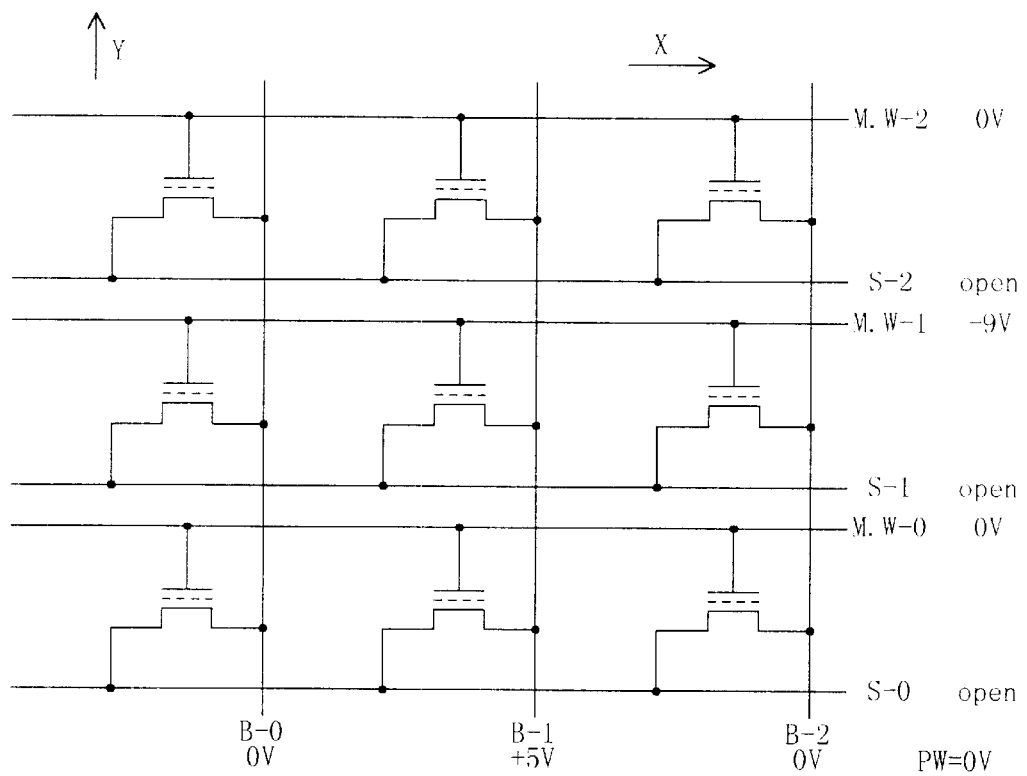
FIG. 26(a) is an electric circuit diagram illustrating voltages applied for writing data into only one memory cell located at the center and selected from the memory cells in the conventional drain-side FN—FN type flash EEPROM.
Figure 26B:
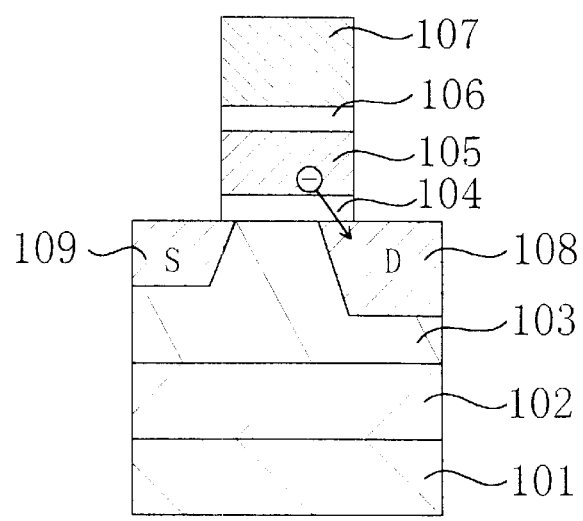
FIG. 26(b) is a cross-sectional view illustrating how electrons move during the write operation.
Figure 27A:
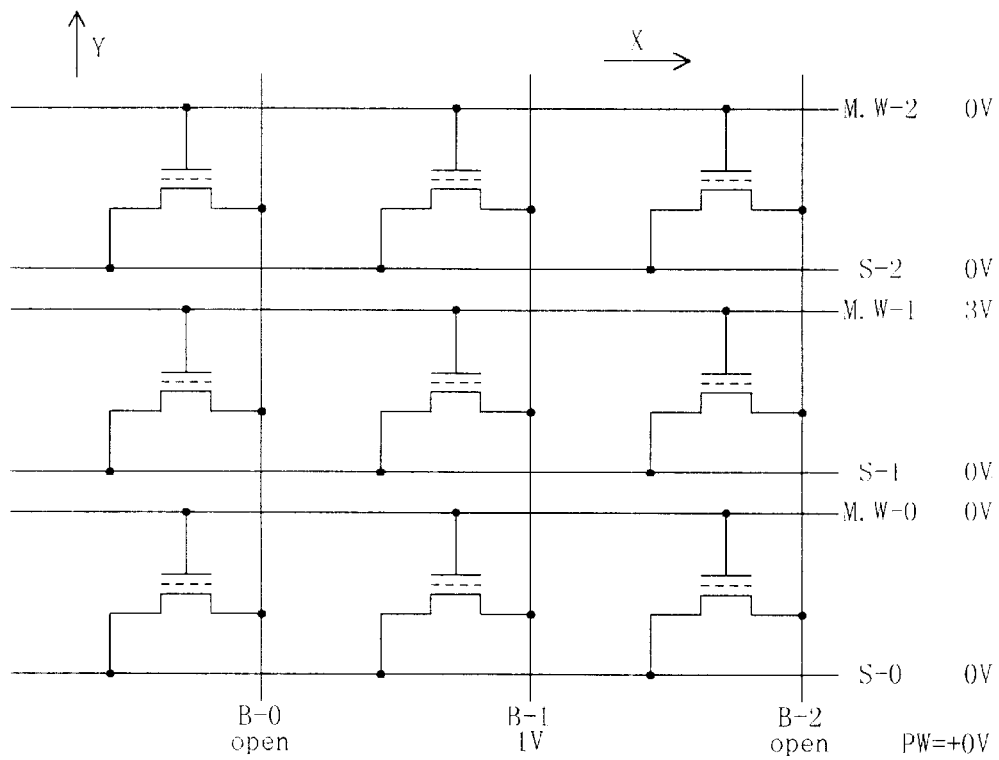
FIG. 27(a) is an electric circuit diagram illustrating voltages applied for reading data from only one memory cell located at the center and selected from the memory cells in the conventional drain-side FN—FN type flash EEPROM.
Figure 27B:
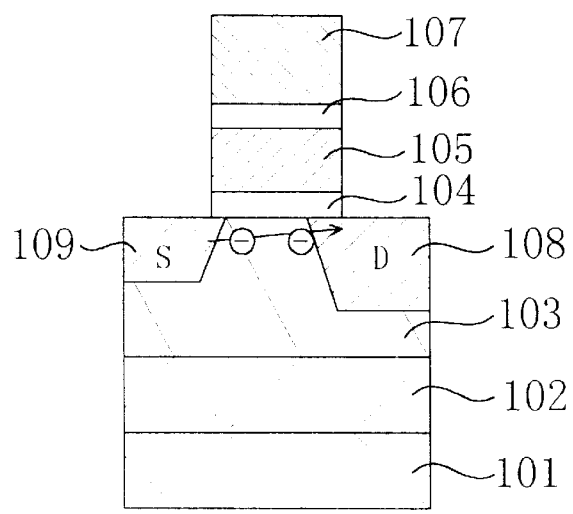
FIG. 27(b) is a cross-sectional view illustrating how electrons move during the read operation.

Moreover, the gate insulating films 4, 11 of the memory transistor and the select transistor are made of a single insulating film formed during the same process step at the same thickness. The threshold voltages of the memory transistor and the select transistor are controlled by the doping level of a dopant implanted at a time. And the drain diffusion layer 8, the source diffusion layer 9 and the intermediate diffusion layer 10 are formed by implanting a dopant at the same time. Accordingly, these diffusion layers 8, 9 and 10 have an equal dopant concentration and the same depth, and therefore are formed symmetrically. By employing such a structure, the process steps for fabricating this semiconductor device can be simplified. In this embodiment, the thickness of the gate insulating films 4, 11 of the memory transistor and the select transistor is set at about 8 nm, because the memory transistor is required to perform write and erase operations by using tunneling current. In the memory cell of the conventional drain-side FN—FN type flash EEPROM shown in FIG. 24, the drain and source diffusion layers 108, 109 should be formed to have different dopant concentrations and diffusion depths during two different process steps so as to generate tunneling current between the drain diffusion layer 108 and the floating gate electrode 105. Accordingly, in such a case, it is difficult to simply the fabrication process and to further reduce the size of the device. Such inconveniences can be eliminated by employing the structure of this embodiment.

Figure 2:
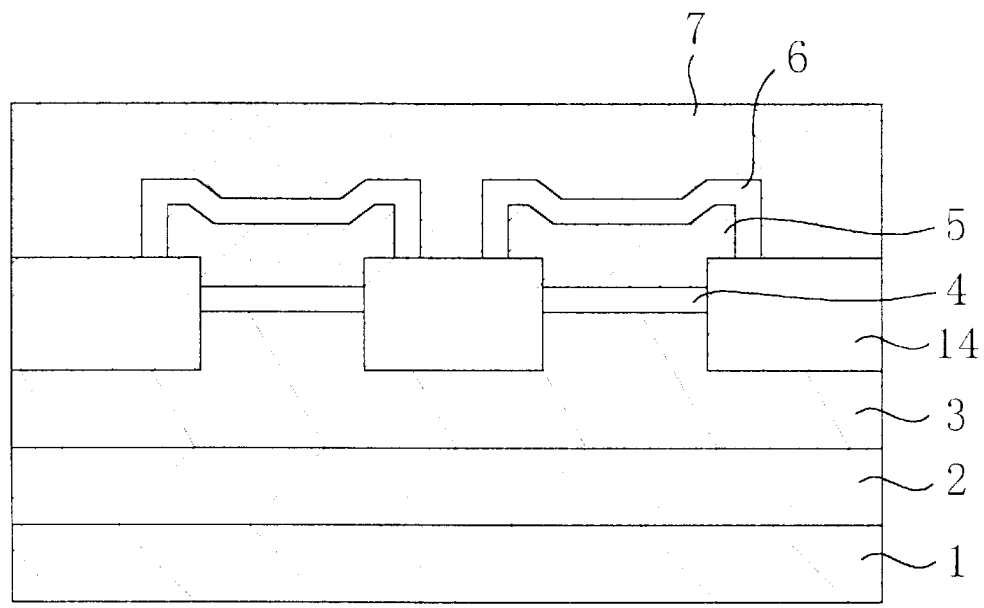
FIG. 2 is a cross-sectional view illustrating the structure of a memory transistor section taken in a direction X in the nonvolatile semiconductor memory device of the first embodiment.

FIG. 2 is a cross-sectional view illustrating the structure of a memory transistor section taken in the direction X (i.e., a cross section including a gate width direction, see FIG. 4(a)) in the nonvolatile semiconductor memory device of the first embodiment. As shown in FIG. 2, the floating gate electrodes 5 of adjacent memory transistors are electrically isolated from each other by an element isolating film 14 provided therebetween.

Figure 3:
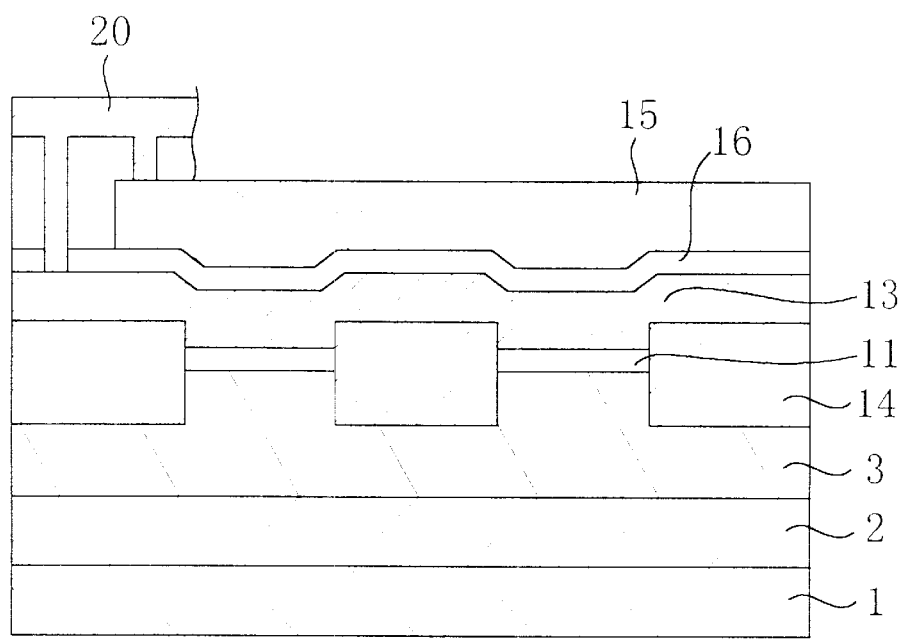
FIG. 3 is a cross-sectional view illustrating the structure of a select transistor section taken in the direction X in the nonvolatile semiconductor memory device of the first embodiment.

FIG. 3 is a cross-sectional view illustrating the structure of a select transistor section taken in the direction x in the nonvolatile semiconductor memory device of the first embodiment. As shown in FIG. 3, the select gate electrode 13 is continuous among the select transistors adjacent to each other in the direction X, and is electrically short-circuited with the dummy electrode 15 at regular intervals through a metal interconnect 20 or the like on the element isolation film 14. However, the select gate electrode 13 is not necessarily electrically short-circuited with the dummy electrode 15.

Figure 4B:
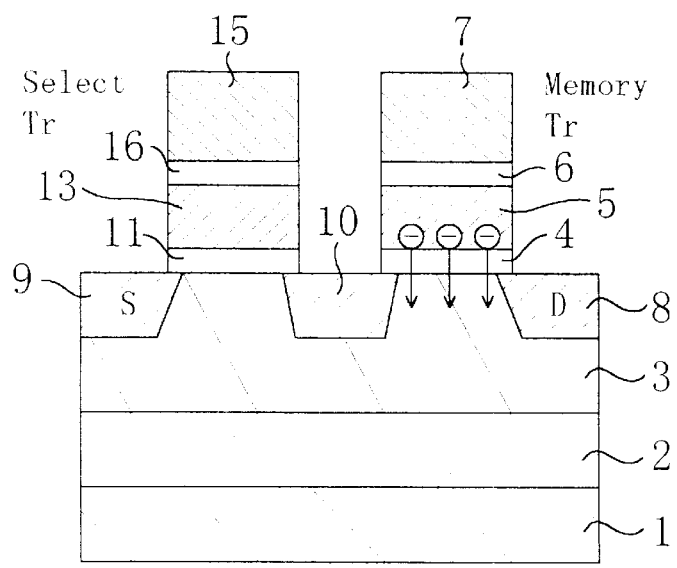

FIG. 4(a) is an electric circuit diagram illustrating voltages applied for simultaneously erasing data from all the memory cells in the nonvolatile semiconductor memory device of the first embodiment, while FIG. 4(b) is a cross-sectional view illustrating how electrons move during the erase operation. In this embodiment, the power supply voltage is assumed to be 1.5 V.

First, with reference to FIG. 4(a), the array structure of the nonvolatile semiconductor memory device in this embodiment will be described. As shown in FIG. 4(a), each memory word line M.W-0, 1, 2 interconnects the control gate electrodes 7 of memory transistors arranged on the same row in the direction X. Each select word line S.W-0, 1, 2 interconnects the select gate electrodes 13 of select transistors arranged on the same row in the direction X. Each source line S-0, 1, 2 interconnects the source diffusion layers 9 of memory cells arranged on the same row in the direction X. And each bit line B-0, 1, 2 interconnects the drain diffusion layers 8 of memory cells arranged on the same column in the direction Y.

In this manner, the source lines are disposed in parallel to the word lines for the memory cells (i.e., the memory word lines and the select word lines), while the bit lines are disposed vertically to the word lines.

Next, an erasing method will be described. FIG. 4(a) illustrates voltages applied for simultaneously erasing data. from all of the nine memory cells illustrated. As shown in FIG. 4(a), a voltage of −8 V is applied to the memory word lines M.W-0, 1, 2, a voltage of +5 V is applied to the P-type well PW, and a voltage of 1.5 V is applied to the select word lines S.W-0, 1, 2. As a result, the potential difference between the control gate electrode 7 and the surface of the channel is 13 V at every memory transistor. Thus, as shown in FIG. 4(b), tunneling current flows from the floating gate electrode 5 into the entire surface region of the channel of the memory transistor, whereby electrons are ejected out of the floating gate electrode 5. In this case, the threshold voltage of the memory transistor is about −1.5 V.

It is noted that the threshold voltage of the select transistor is set at about 0.6 V. The potential in the select word lines S.W-0, 1, 2 is set equal to the power supply voltage of 1.5 V, in order to weaken the electric field applied to the gate insulating film 11 (thickness: about 8 nm) of the select transistor. When these voltages are respectively applied, the electric field applied to the gate insulating film 11 of the select transistor is 4.4 MV/cm, which is less than 5 MV/cm as a general reference level below which reliability is ensured. Accordingly, the deterioration in reliability, resulting from the deterioration of the gate insulating film 11, can be prevented.

Also, a potential equal to that applied to the P-type well 3 may be applied to the source lines S-0, 1, 2 and the bit lines B-0, 1, 2.

Alternatively, a voltage of 0 V (ground potential) may be applied to the memory word lines M.W-0, 1, 2 and a voltage of +13 V may be applied to the P-type well (PW) 3. In such a case, since no negative voltage is applied, the peripheral circuits can be advantageously simplified. On the downside, since the absolute value of the positive voltage is larger (i.e., increases from 5 to 13), the breakdown voltage of the transistor should be increased.

Figure 5A:
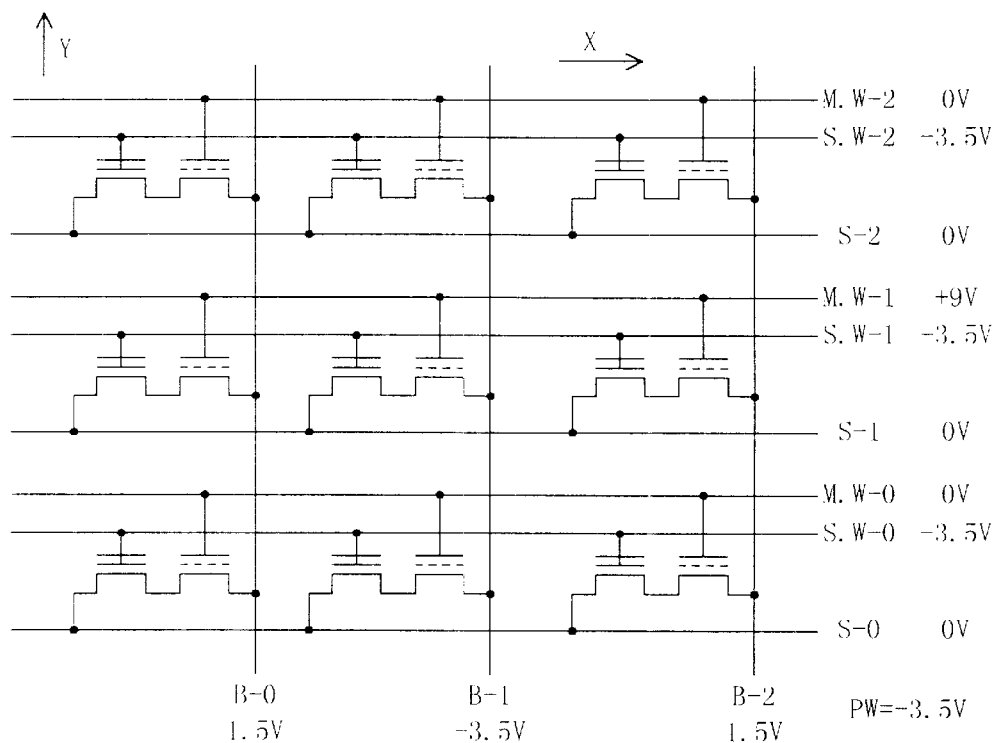
FIG. 5($a$) is an electric circuit diagram illustrating voltages applied for writing data into only one memory cell located at the center and selected from the memory cells in the nonvolatile semiconductor memory device of the first embodiment.
Figure 5B:
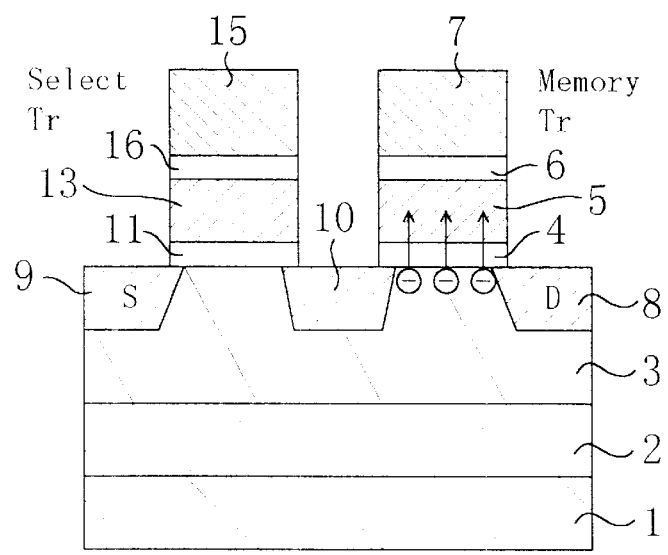

Next, a writing method will be described. FIG. 5(a) is an electric circuit diagram illustrating voltages applied for writing data into only one memory cell located at the center and selected from the nine memory cells in the nonvolatile semiconductor memory device of this embodiment. And FIG. 5(b) is a cross-sectional view illustrating how electrons move during the write operation. As shown in FIG. 5(a), a voltage of +9 V is applied to the memory word line M.W-1 connected to the control gate electrode of a selected memory cell. A voltage of −3.5 V is applied to the select word line S.W-1 connected to the select gate electrode of the selected memory cell. A voltage of −3.5 V is applied to the bit line B-1 connected to the drain diffusion layer of the selected memory cell. And a voltage of −3.5 V is applied to the P-type well PW. As a result, the potential difference between the control gate electrode 7 of the memory transistor and the surface of the channel is 12.5 V at the selected memory cell. Thus, as shown in FIG. 5(b), tunneling current flows from the entire surface of the channel into the floating gate electrode 5 of the memory transistor, whereby electrons are injected into the floating gate electrode 5. In this case, the threshold voltage of the memory transistor is about 1 V.

Also, in order to prevent the data from being erroneously written into the non-selected memory cells, a voltage of 0 V is applied to the other memory word lines M.W-0, 2, a voltage of −3.5 V is applied to the other select word lines S.W-0, 2 and a voltage of 1.5 V is applied to the other bit lines B-0, 2. As a result, the potential difference between the control gate electrode 7 and the surface of the channel can be no greater than 7.5 V at the non-selected memory cells, and it is possible to prevent the data from being erroneously written into the non-selected memory cells. In this embodiment, it is in order to turn all the select transistors OFF that a voltage of −3.5 V is applied to all the select word lines S.W-0, 1, 2. As described in the background section, the application of this voltage is intended to prevent erroneous writing.

Alternatively, a write operation may be performed by respectively applying voltages of +12.5 V, 0 V, 0 V and 0 V to the memory word line M.W-1, the select word line S.W-1 and the bit line B-1 and the P-type well PW without applying any negative voltage. In such a case, in order to prevent data from being erroneously written into the non-selected memory cells, voltages of 0 V, 0 V and 5.0 V may be applied to the other memory word lines M.W-0, 2, the other select word lines S.W-0, 2 and the other bit lines B-0, 2, respectively.

In the first embodiment, the gate length of the select gate electrode 13 of the select transistor is set at about 0.5 μm in order to secure a source-to-drain breakdown voltage of about 5 V. Since the select gate electrode 13 of this embodiment is not in the shape of a sidewall unlike the memory cell of the conventional nonvolatile semiconductor memory device shown in FIG. 28, the gate length thereof may be set at an arbitrary value. The gap between the select transistor and the memory transistor is almost as large as a minimum design rule (e.g., about 0.3 μm). Accordingly, unlike the conventional nonvolatile semiconductor memory device shown in FIG. 28, the deterioration in reliability of the lateral interelectrode insulating film 112 has nothing to do with this embodiment.

Figure 6A:
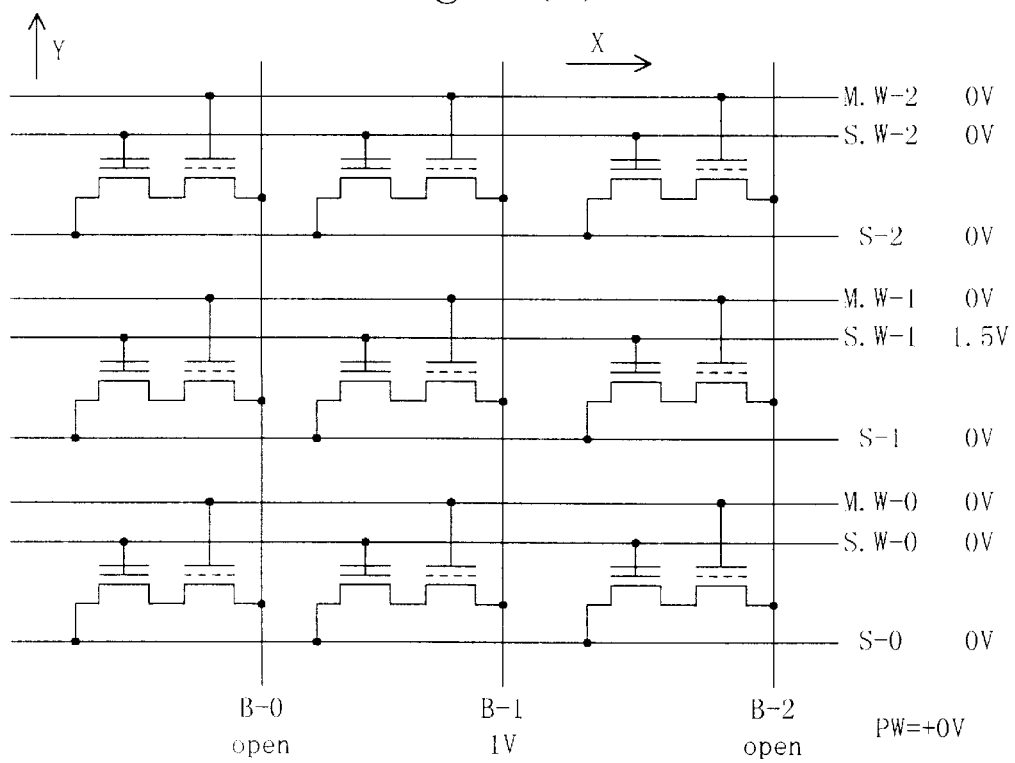
FIG. 6($a$) is an electric circuit diagram illustrating voltages applied for reading data from only one memory cell located at the center and selected from the memory cells in the nonvolatile semiconductor memory device of the first embodiment.
Figure 6B:
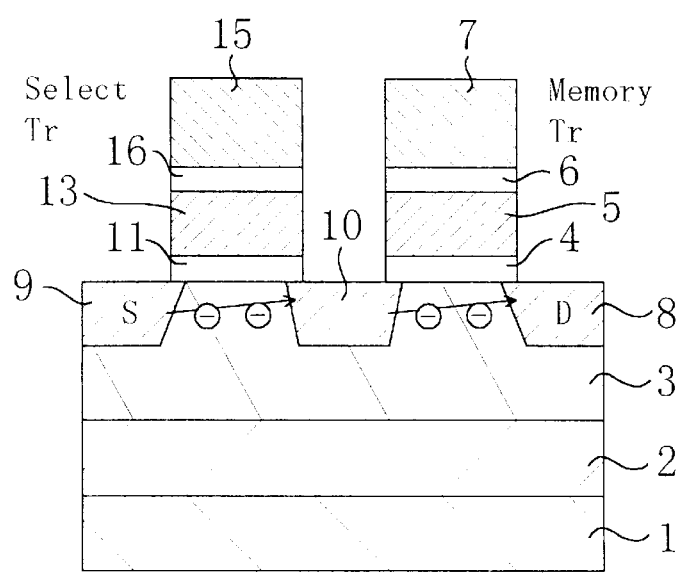

Next, a reading method will be described. FIG. 6(a), is an electric circuit diagram illustrating voltages applied for reading data from only one memory cell located at the center and selected from the nine memory cells in the nonvolatile semiconductor memory device of this embodiment. And FIG. 6(b) is a cross-sectional view illustrating how electrons move during the read operation. As shown in FIG. 6(a), a voltage of 0 V is applied to all the memory word lines M.W-0, 1, 2 for all the memory cells. A voltage of 1.5 V is applied to the select word line S.W-1 connected to the selected memory cell, while a voltage of 0 V is applied to the other select word lines S.W-0, 2. A voltage of 1 V is applied to the bit line B-1 connected to the selected memory cell, while the other bit lines B-0, 2 are opened. And a voltage of 0 V is applied to the P-type well PW. As a result, while the memory transistor of the selected memory cell is in erase state (VT=−2 V), electrons move and current flows as shown in FIG. 6(b). On the other hand, while the memory transistor of the selected memory cell is in write state (VT=1 V), the current does not flow. Thus, based on this current flow, the existence of data stored can be sensed.

In this manner, in accordance with the reading method of this embodiment, there is no need to select a particular memory word line because the voltage applied to the select word line connected to the select gate electrode 13 of the selected memory cell is controlled during reading. The configuration of a decoder for a memory word line is complicated because the decoder is driven with a high positive or negative voltage. By comparison, the configuration of a decoder for a select word line is simpler. Accordingly, such a reading method is advantageous in increasing a read speed, which should be far higher than a write speed or an erase speed. In addition, this method can also effectively suppress a gate read disturb phenomenon during reading. The "gate read disturb" is a phenomenon that data is erroneously written into or erased from a memory cell owing to a readout gate voltage applied to the control gate electrode.

It is noted that a positive voltage equal to or lower than the threshold voltage of a memory cell may be applied to the word lines for all the memory cells, or to only the memory word line of a selected memory cell. However, the method of this embodiment is the simplest of all of these.

Figure 28:
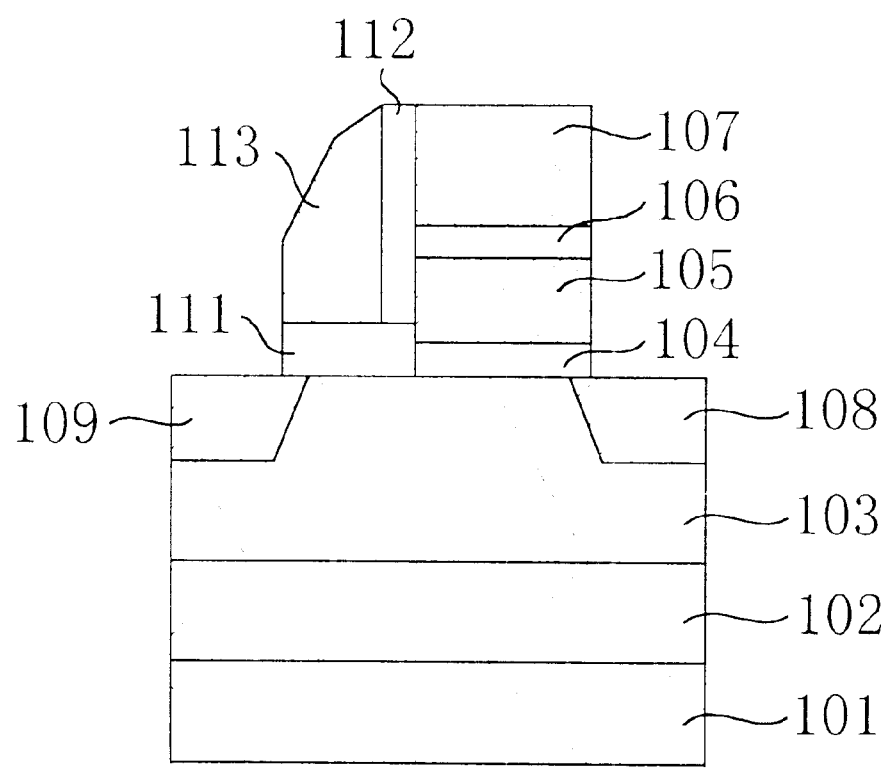
FIG. 28 is a cross-sectional view illustrating the structure for a memory cell including a sidewall-shaped select transistor in a conventional nonvolatile semiconductor memory device.
Figure 29A:
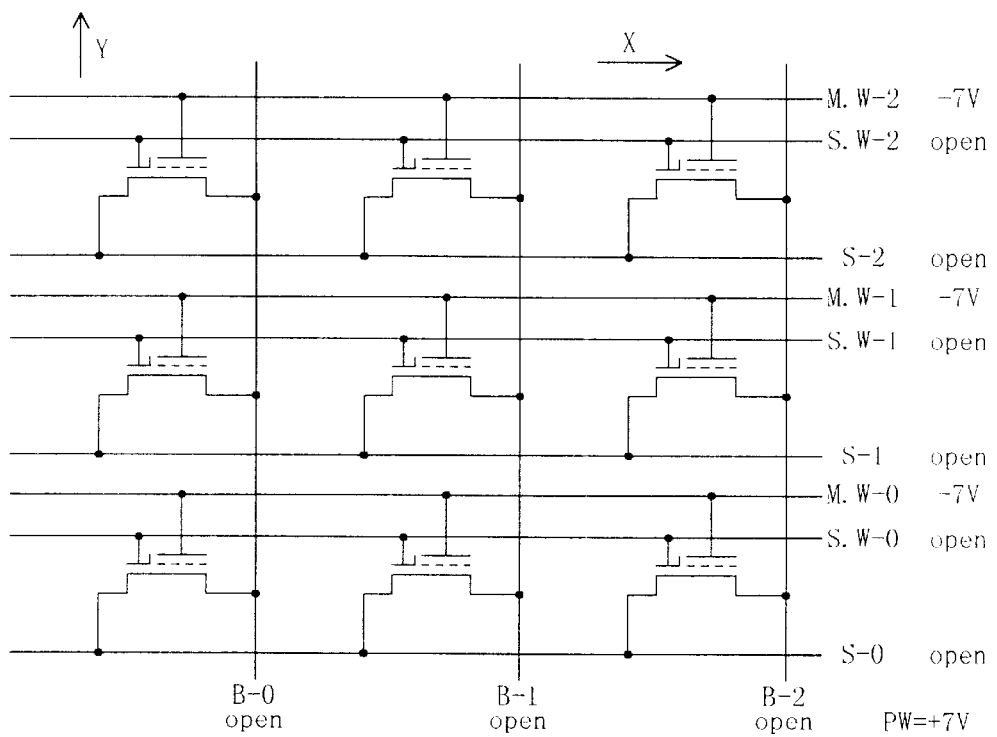
FIG. 29(a) is an electric circuit diagram illustrating voltages applied for simultaneously erasing data from all the memory cells, each including a sidewall-shaped select transistor, in the nonvolatile semiconductor memory device shown in FIG. 28.
Figure 29B:
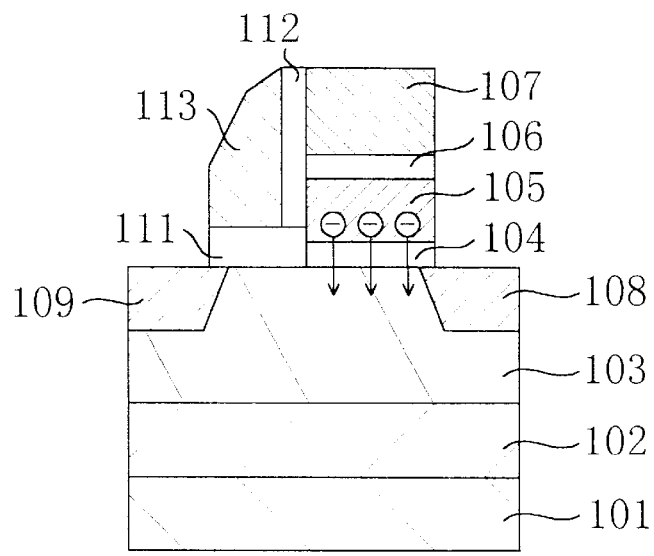
FIG. 29(b) is a cross-sectional view illustrating how electrons move during the erase operation.
Figure 30A:
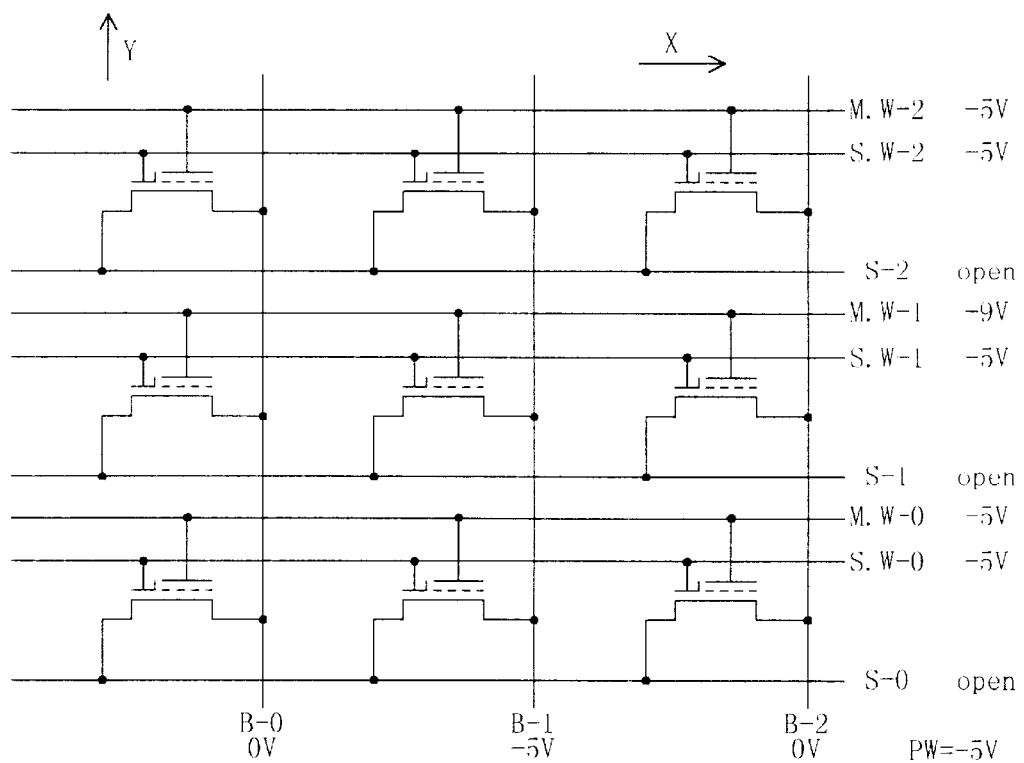
FIG. 30(a) is an electric circuit diagram illustrating voltages applied for writing data into only one memory cell located at the center and selected from the memory cells, each including a sidewall-shaped select transistor, in the nonvolatile semiconductor memory device shown in FIG. 28.
Figure 30B:
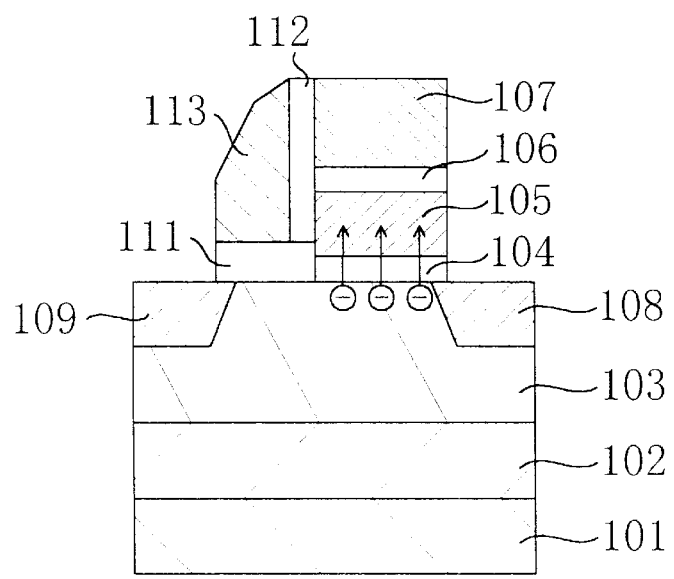
FIG. 30(b) is a cross-sectional view illustrating how electrons move during the write operation.
Figure 31A:
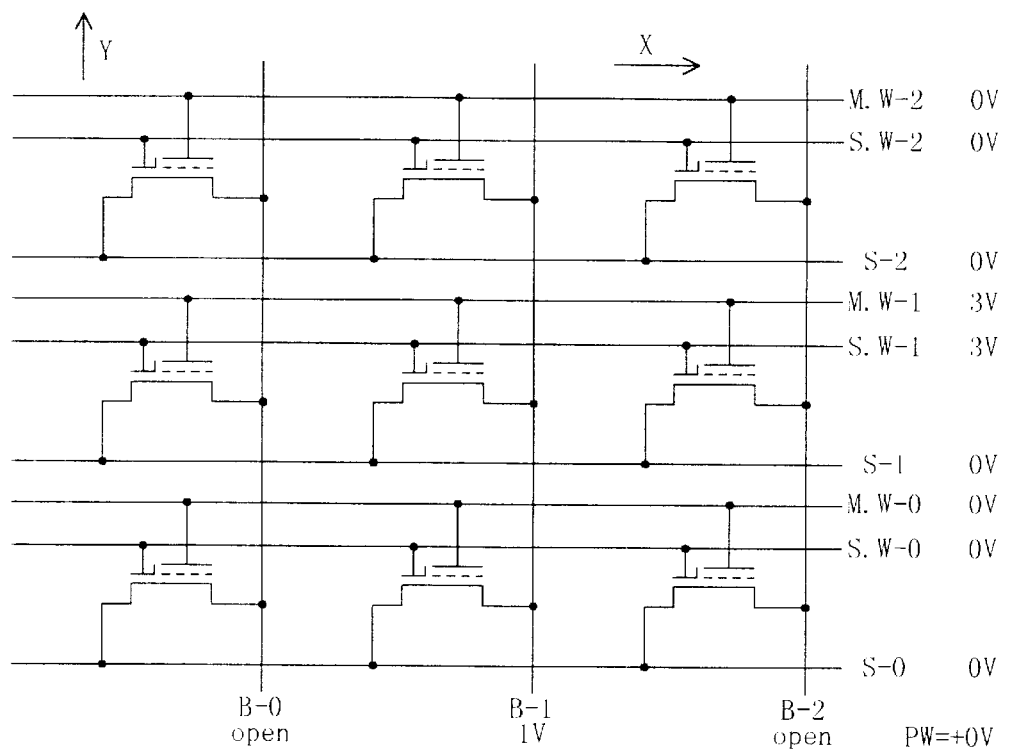
FIG. 31(a) is an electric circuit diagram illustrating voltages applied for reading data from only one memory cell located at the center and selected from the memory cells, each including a sidewall-shaped select transistor, in the nonvolatile semiconductor memory device shown in FIG. 28.
Figure 31B:
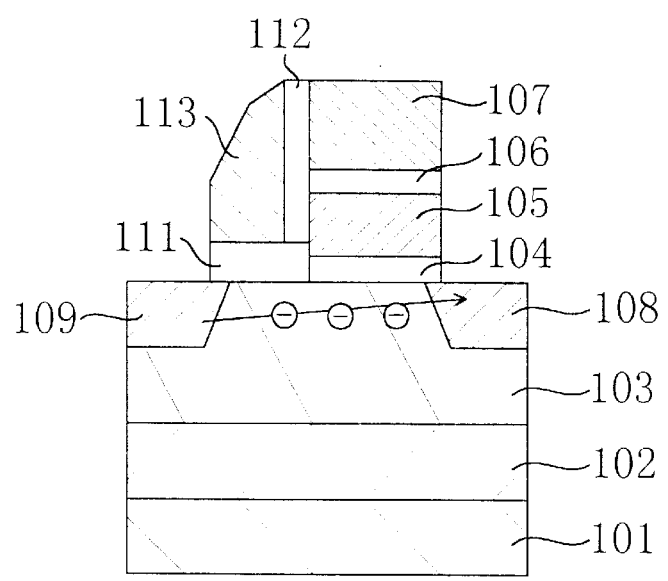
FIG. 31(b) is a cross-sectional view illustrating how electrons move during the read operation.

As can be understood, the nonvolatile semiconductor memory device of this embodiment can also attain all the advantages of the conventional nonvolatile semiconductor memory device shown in FIG. 28 over the drain-side FN—FN type flash EEPROM. Specifically, the device of this embodiment 1. improves the reliability;
2. consumes less power during writing and erasing; and
3. lowers the power supply voltage for reading.

In addition, the device of this embodiment can solve the following two disadvantages of the nonvolatile semiconductor memory device shown in FIG. 28:

1. degraded reliability of the lateral interelectrode insulating film; and
2. insufficient breakdown voltage of a select transistor including a select gate electrode shaped like a sidewall.

Therefore, the nonvolatile semiconductor memory device of this embodiment can provide a highly implementable structure while simultaneously exhibiting satisfactory characteristics.

In order to solve this problem (2) as an obstacle to the implementation of the nonvolatile semiconductor memory device shown in FIG. 28, the gate length of the select gate electrode of the select transistor should be 0.2 μm or more in the nonvolatile semiconductor memory device of the first embodiment. Thus, this device is somewhat disadvantage in terms of miniaturization. However, in actuality, if the present invention is applied to a fabrication process carried out under a design rule of about 0.35 μm, this increase in area of the gate electrode is negligible. In a conventional flash EEPROM, a single-transistor structure including only a memory transistor has prevailed in order to reduce the area occupied by the flash EEPROM. Also, even when a select transistor is provided for a flash EEPROM, the area occupied by the flash EEPROM is reduced as much as possible by using a sidewall-shaped select gate electrode as shown in FIG. 28. However, as the case may be (in a flash EEPROM for microcomputers, for example), low-voltage operation, improvement of reliability and/or compatibility with a semiconductor fabrication process for microcomputers has higher priority than reduction of the area, except for a general-purpose flash EEPROM. Thus, the nonvolatile semiconductor memory device of the present invention is particularly suitable for these applications.

Embodiment 2

Next, the second embodiment of the present invention will be described. In the nonvolatile semiconductor memory device of the second embodiment, the source lines are provided independently in parallel to respective bit lines (vertically to respective word lines).

In the nonvolatile semiconductor memory device of this embodiment, the structures of the memory transistor and the select transistor are totally the same as those of the first embodiment, and the illustration and description thereof will be omitted herein.

Figure 7:
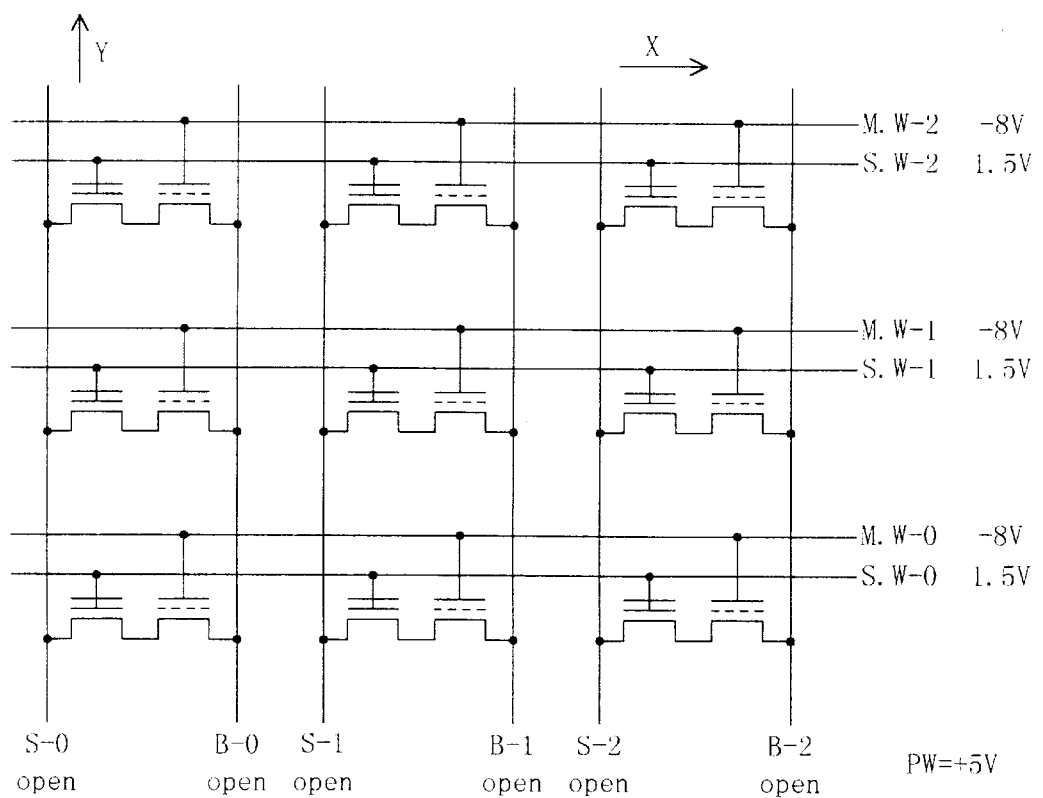
FIG. 7 is an electric circuit diagram illustrating voltages applied during erasing in a nonvolatile semiconductor memory device of the second embodiment.

FIG. 7 is an electric circuit diagram illustrating voltages applied during erasing in the nonvolatile semiconductor memory device of this embodiment. In this embodiment, the power supply voltage is assumed to be 1.5 V.

First, with reference to FIG. 7, the array structure of the nonvolatile semiconductor memory device in this embodiment will be described. As shown in FIG. 7, each memory word line M.W-0, 1, 2 interconnects the control gate electrodes 7 of memory transistors arranged on the same row in the direction X. Each select word line S.W-0, 1, 2 interconnects the select gate electrodes 13 of select transistors arranged on the same row in the direction X. Each source line S-0, 1, 2 interconnects the source diffusion layers 9 of memory cells arranged on the same column in the direction Y. And each bit line B-0, 1, 2 interconnects the drain diffusion layers 8 of memory cells arranged on the same column in the direction Y.

As can be understood, the array structure of this embodiment is different from that of the first embodiment in that not only the bit lines B-0, 1, 2, but also the source lines S-0, 1, 2 are disposed vertically to the word lines for memory cells (i.e., the memory word lines M.W-0, 1, 2 and the select word lines S.W-0, 1, 2). In other words, each source line S-0, 1, 2 is provided electrically independently between a pair of memory cells adjacent to each other in the direction X.

Next, an erasing method of the nonvolatile semiconductor memory device in this embodiment will be described. FIG. 7 illustrates voltages applied for simultaneously erasing data from all of the nine memory cells illustrated. As shown in FIG. 7, a voltage of −8 V is applied to all the memory word lines M.W-0, 1, 2. A voltage of 1.5 V is applied to all the select word lines S.W-0, 1, 2. All the bit lines B-0, 1, 2 and the source lines S-0, 1, 2 are opened. And a voltage of +5 V is applied to the P-type well PW. In this case, the era-se operation is performed in the same manner as in the first embodiment (see FIG. 4(b)), and the detailed description thereof will be omitted herein.

Figure 8:
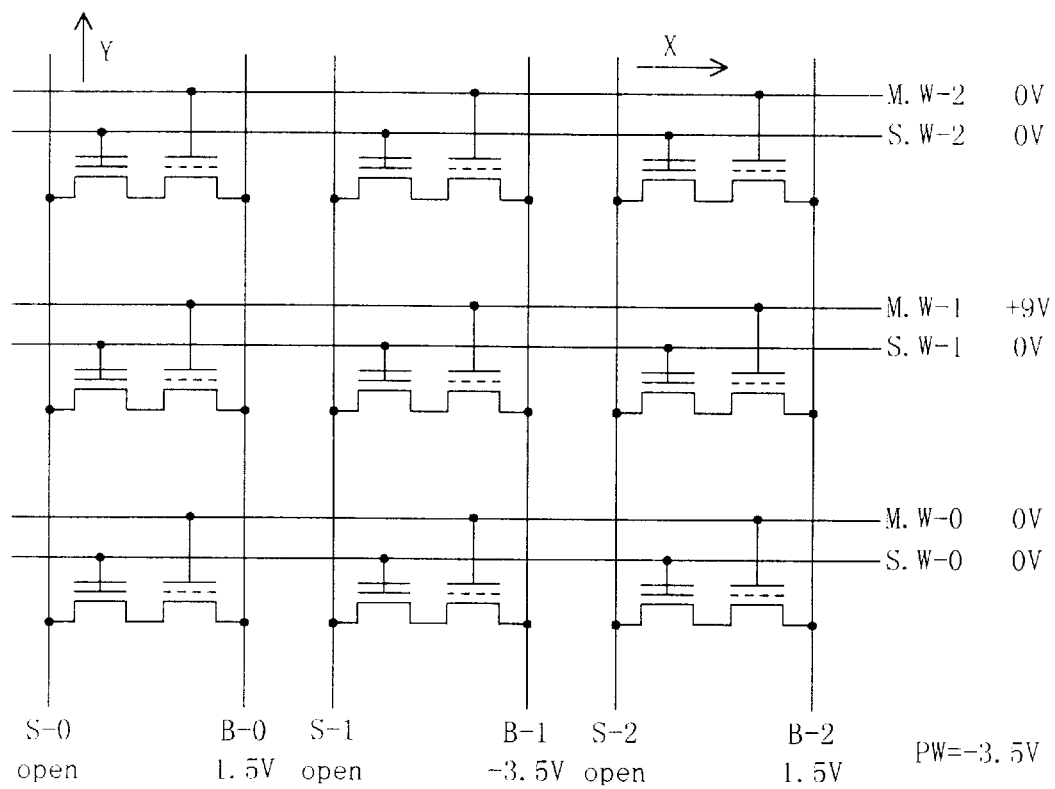
FIG. 8 is an electric circuit diagram illustrating voltages applied for writing data into only one memory cell located at the center and selected from the memory cells in the nonvolatile semiconductor memory device of the second embodiment.

Next, a writing method of the nonvolatile semiconductor memory device of this embodiment will be described. FIG. 8 is an electric circuit diagram illustrating voltages applied for writing data into only one memory cell located at the center and selected from the nine memory cells. As shown in FIG. 8, a voltage of +9 V is applied to the memory word line M.W-1 connected to the control gate electrode of a selected memory cell. A voltage of 0 V is applied to the select word line S.W-1 connected to the select gate electrode of the selected memory cell. A voltage of −3.5 V is applied to the bit. line B-1 connected to the drain diffusion layer of the selected memory cell. And a voltage of −3.5 V is applied to the P-type well PW. As a result, the potential difference between the control gate electrode 7 of the memory transistor and the surface of the channel is 12.5 V at the selected memory cell. Thus, as in FIG. 5(b), tunneling current flows from the entire surface region of the channel of the memory transistor into the floating gate electrode 5 of the memory transistor, whereby electrons are injected into the floating gate electrode 5. In this case, the threshold voltage of the memory transistor is about 1 V.

Also, in order to prevent the data from being erroneously written into the non-selected memory cells, a voltage of 0 V is applied to the other memory word lines M.W-0, 2, and a voltage of 1.5 V is applied to the other bit lines B-0, 2. As a result, the potential difference between the control gate electrode 7 and the surface of the channel can be no greater than 7.5 V at the non-selected memory cells, and it is possible to prevent the data from being erroneously written into the non-selected memory cells.

In this embodiment, the select transistors need not be turned OFF unlike the first embodiment. This is because no leakage current is generated between bit lines through a source line, since the source lines are provided electrically independently in parallel to the respective bit lines.

It is in order to weaken the electric field applied to the gate insulating film (thickness: about 8 nm) of the select transistor that a voltage of 0 V is applied to all the select word lines S.W-0, 1, 2 as shown in FIG. 8. Thus, the applied voltage may be set at any other value.

Figure 9:
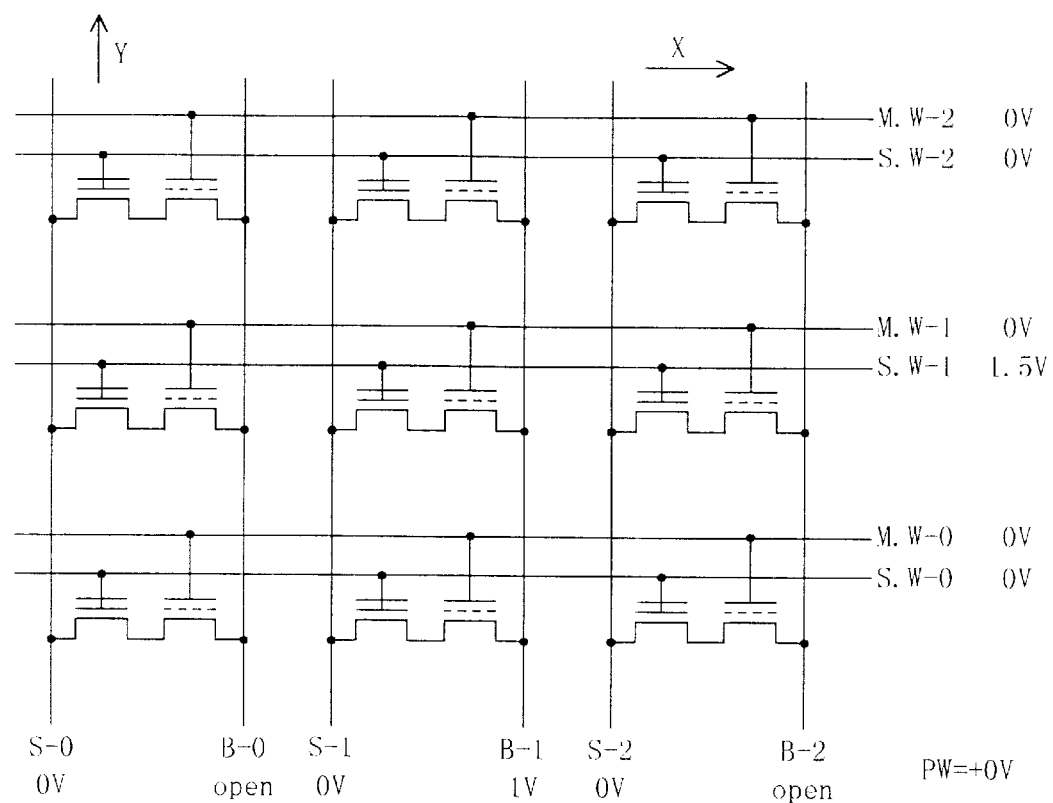
FIG. 9 is an electric circuit diagram illustrating voltages applied for reading data from only one memory cell located at the center and selected from the memory cells in the nonvolatile semiconductor memory device of the second embodiment.

Next, a reading method of the nonvolatile semiconductor memory device in this embodiment will be described. FIG. 9 is an electric circuit diagram illustrating voltages applied for reading data from only one memory cell located at the center and selected from the nine memory cells. As shown in FIG. 9, a voltage of 0 V is applied to all the memory word lines M.W-0, 1, 2 for all the memory cells. A voltage of 1.5 V is applied to the select word line S.W-1 connected to the select gate electrode of a selected memory cell, while a voltage of 0 V is applied to the other select word lines S.W-0, 2. A voltage of 1 V is applied to the bit line B-1 connected to the drain diffusion layer of the selected memory cell, while the other bit lines B-0, 2 are opened. And a voltage of 0 V is applied to the P-type well PW. In this case, the read operation is performed in the same manner as in the first embodiment (see FIG. 6(b)), and the detailed description thereof will be omitted herein.

In accordance with the method for driving a nonvolatile semiconductor memory device of this embodiment, the voltage applied to a select word line is always in the range from 0 V to 1.5 V all through the erase, write and read operations. Accordingly, a decoder for controlling a select word line may be a very small transistor having a breakdown voltage substantially as low as the power supply voltage (1.5 V). Thus, this embodiment is advantageous in reducing the area of a decoder for controlling the select word line and in realizing a higher-speed operation.

In this second embodiment, only a method using negative voltages has been described. Alternatively, a driving method not using a negative voltage may also be employed as mentioned in the first embodiment.

As can be understood, the nonvolatile semiconductor memory device of this embodiment can also attain all of the advantages of the conventional nonvolatile semiconductor memory device shown in FIG. 28 over the drain-side FN—FN type flash EEPROM. Specifically, the device of this embodiment 1. improves the reliability;
2. consumes less power during writing and erasing; and
3. lowers the power supply voltage for reading.

In addition, the device of this embodiment can solve the following two disadvantages of the nonvolatile semiconductor memory device shown in FIG. 28:

1. degraded reliability of the lateral interelectrode insulating film; and
2. insufficient breakdown voltage of a select transistor including a sidewall-shaped select gate electrode.

In order to solve this problem (2) as an obstacle to the implementation of the nonvolatile semiconductor memory device shown in FIG. 28, the gate length of the select gate electrode of the select transistor should be 0.2 μm or more in the first embodiment. Thus, the device of the first embodiment is somewhat disadvantage in terms of miniaturization. By contrast, in this second embodiment, since the source lines are arranged in a different manner to solve this problem, there is no need to set the breakdown voltage of the select transistor at 5 V or more. Accordingly, it is no longer necessary to limit the gate length of a select gate electrode of the select transistor in order to solve the problem (2) barring the implementation of the nonvolatile semiconductor memory device shown in FIG. 28. Consequently, this embodiment is more advantageous than the first embodiment in terms of miniaturization.

Embodiment 3

In the conventional nonvolatile semiconductor memory device shown in FIG. 28 and the nonvolatile semiconductor memory device of the first and second embodiments, positive and negative voltages should be both applied to bit lines, and therefore, the configuration of a bit line driver is adversely complicated. In particular, since a bit line driver includes a read circuit, an overly complicated bit line driver is disadvantageous to the implementation of a high-speed read operation.

Thus, the third embodiment provides a means for eliminating such a disadvantage. Specifically, in the nonvolatile semiconductor memory device of the third embodiment, source lines are also disposed electrically independently in parallel to respective bit lines (i.e., vertically to the word lines).

In the nonvolatile semiconductor memory device of this embodiment, the structures of the memory transistor and the select transistor are substantially the same as those of the first embodiment, and the illustration and description thereof will be omitted herein. However, in this embodiment, these transistors are disposed in an opposite manner to the first and second embodiments. That is to say, in a memory cell of this embodiment, a memory transistor is disposed adjacent to the source diffusion layer 9 and a select transistor is disposed adjacent to the drain diffusion layer 8.

Figure 10A:
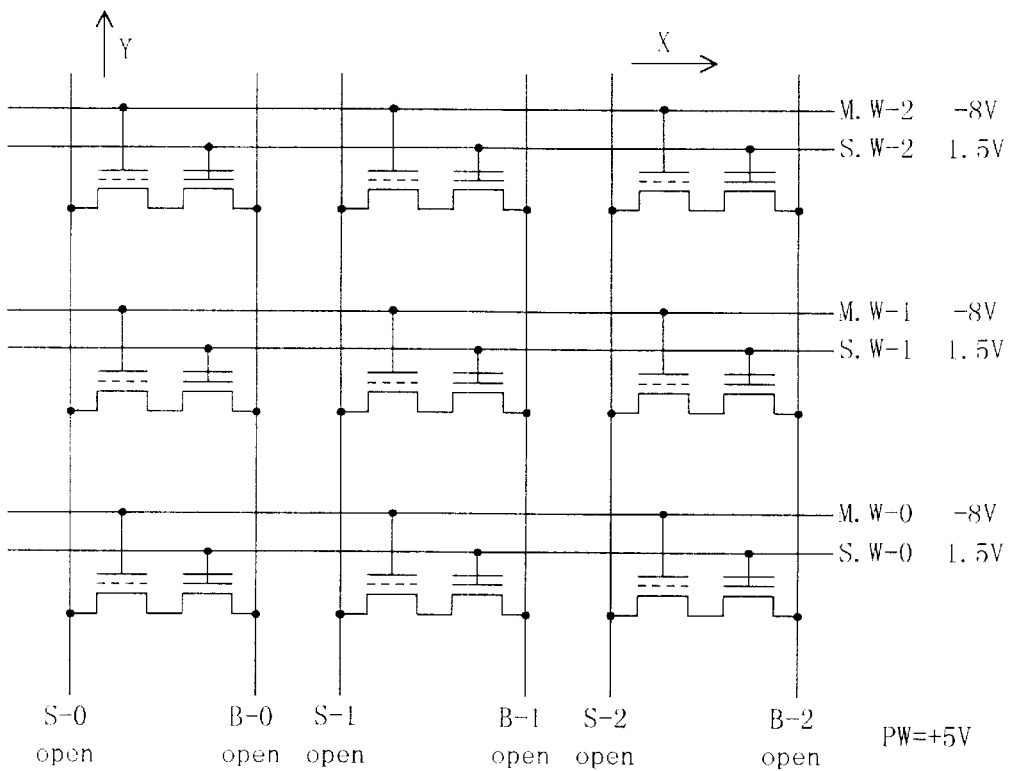
FIG. 10($a$) is an electric circuit diagram illustrating voltages applied for simultaneously erasing data from all the memory cells in a nonvolatile semiconductor memory device of the third embodiment.
Figure 10B:
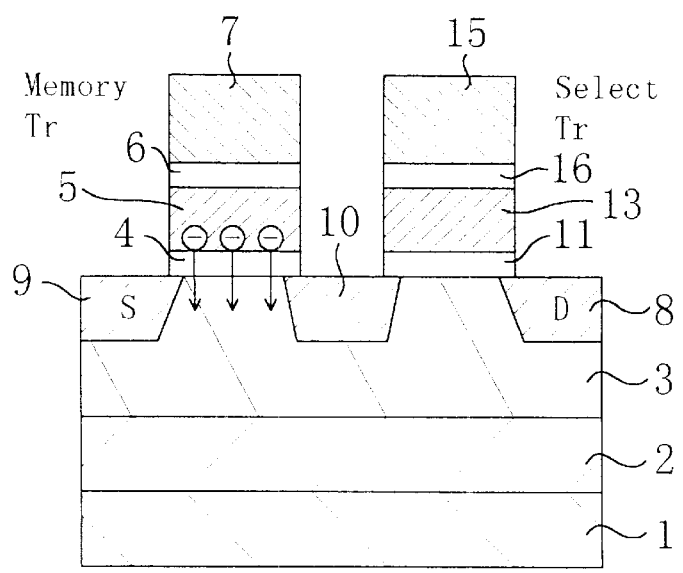

FIG. 10(a) is an electric circuit diagram illustrating voltages applied for simultaneously erasing data from all the memory cells in the nonvolatile semiconductor memory device of the third embodiment, while FIG. 10(b) is a cross-sectional view illustrating how electrons move during the erase operation. In this embodiment, the power supply voltage is assumed to be 1.5 V.

As shown in FIG. 10(a), the array structure of this embodiment is the same as the array structure of the second embodiment shown in FIG. 7. The nonvolatile semiconductor memory device of the third embodiment also performs the erase method and operation in the same way as the device of the second embodiment (see FIGS. 7 and 10(a)). Specifically, by applying the voltages shown in FIG. 10(a), tunneling current flows from the floating gate electrode 5 into the entire surface region of the channel of the memory transistor, whereby electrons are ejected out of the floating gate electrode 5 as shown in FIG. 10(b).

Figure 11A:
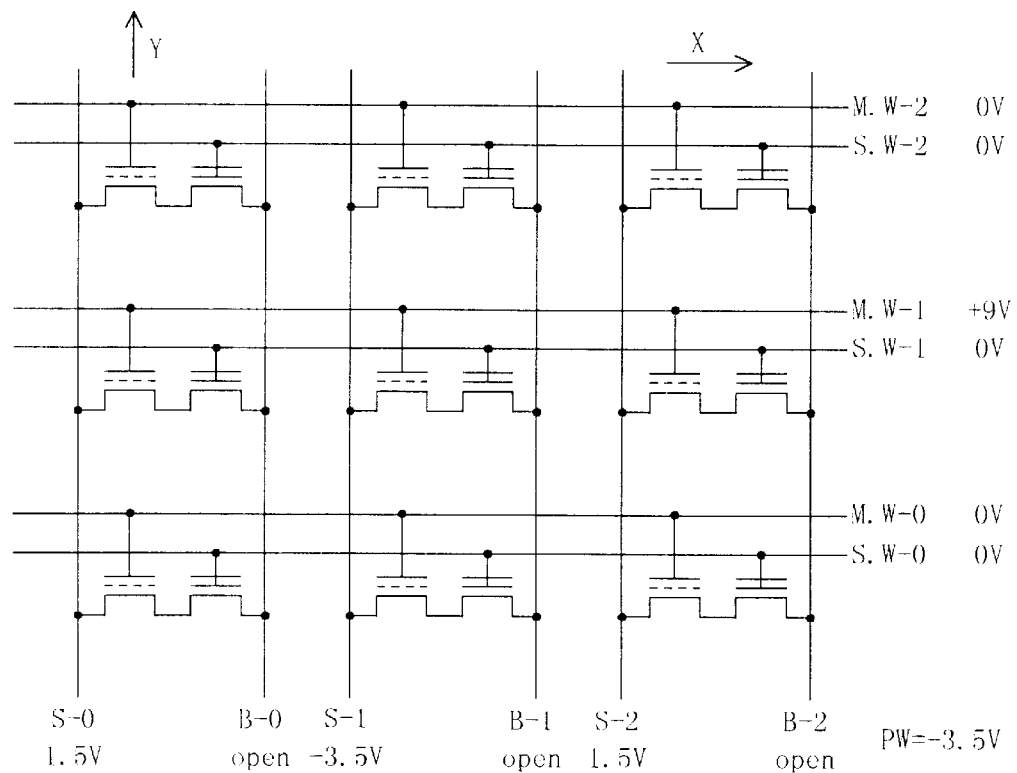
FIG. 11($a$) is an electric circuit diagram illustrating voltages applied for writing data into only one memory cell located at the center and selected from the memory cells in the nonvolatile semiconductor memory device of the third embodiment.
Figure 11B:
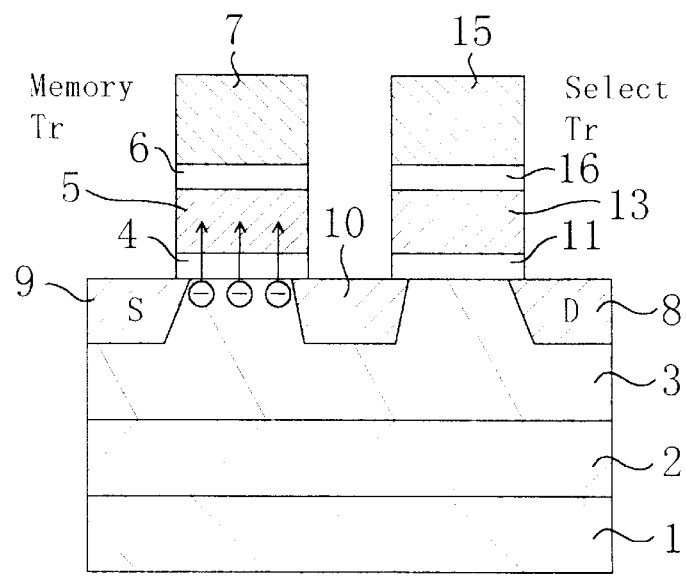

Next, a writing method of the nonvolatile semiconductor memory device in this embodiment will be described. FIG. 11(a) is an electric circuit diagram illustrating voltages applied for writing data into only one memory cell located at the center and selected from the memory cells in the nonvolatile semiconductor memory device of the third embodiment. And FIG. 11(b) is a cross-sectional view illustrating how electrons move during the write operation. As shown in FIG. 11(a), a voltage of +9 V is applied to the memory word line M.W-1 connected to the control gate electrode of a selected memory cell. A voltage of 0 V is applied to the select word line S.W-1 connected to the select gate electrode of the selected memory cell. A voltage of −3.5 V is applied to the source line S-1 connected to the source diffusion layer of the selected memory cell. And a voltage of −3.5 V is applied to the P-type well PW. As a result, the potential difference between the control gate electrode 7 and the surface of the channel is 12.5 V at the memory transistor of the selected memory cell. Thus, as shown in FIG. 11(b), tunneling current flows from the entire surface region of the channel of the memory transistor into the floating gate electrode 5 of the memory transistor, whereby electrons are injected into the floating gate electrode 5. In this case, the threshold voltage of the memory transistor is about 1 V.

Also, in order to prevent data from being erroneously written into the non-selected memory cells, a voltage of 0 V is applied to the other memory word lines M.W-0, 2 and select word lines S.W-0, 2 and a voltage of 1.5 V is applied to the other source lines S-0, 2. As a result, the potential difference between the control gate electrode 7 and the surface of the channel can be no greater than 7.5 V at the memory transistors of the non-selected memory cells. Consequently, it is possible to prevent the data from being erroneously written into the non-selected memory cells. It is noted that the bit lines B-0, 1, 2 are all opened in this embodiment.

In the nonvolatile semiconductor memory device of this embodiment, since the memory transistor is disposed adjacent to the source diffusion layer 9, it is no longer necessary to apply a negative voltage to the bit line connected to the selected memory cell during writing.

Figure 12A:
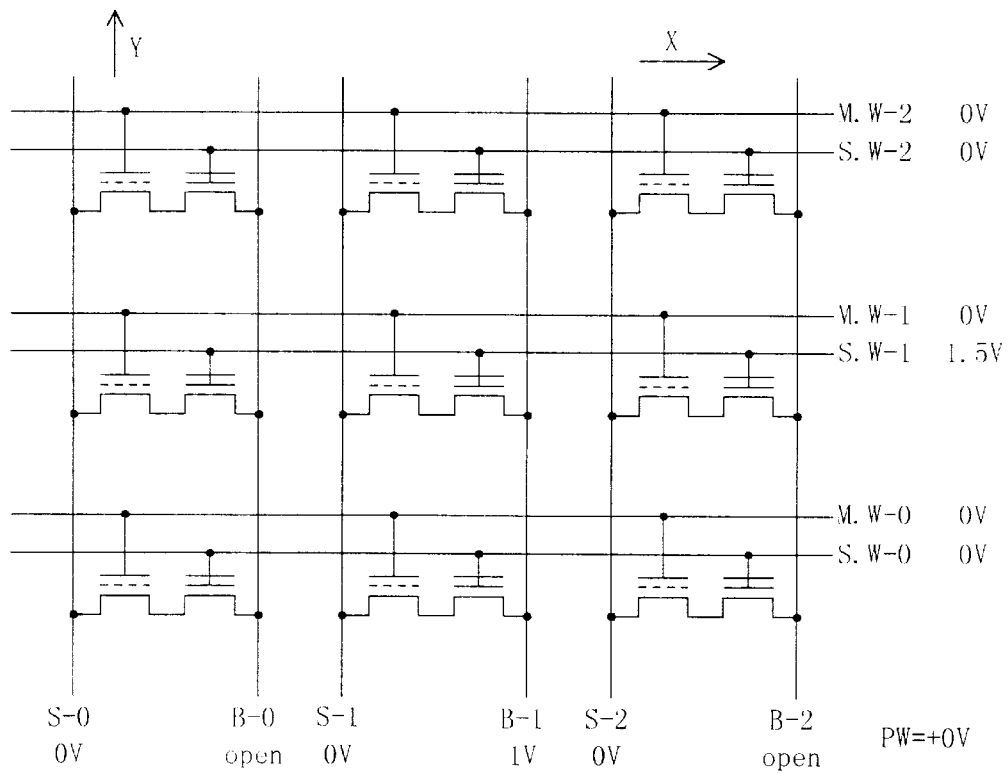
FIG. 12($a$) is an electric circuit diagram illustrating voltages applied for reading data from only one memory cell located at the center and selected from the memory cells in the nonvolatile semiconductor memory device of the third embodiment.
Figure 12B:
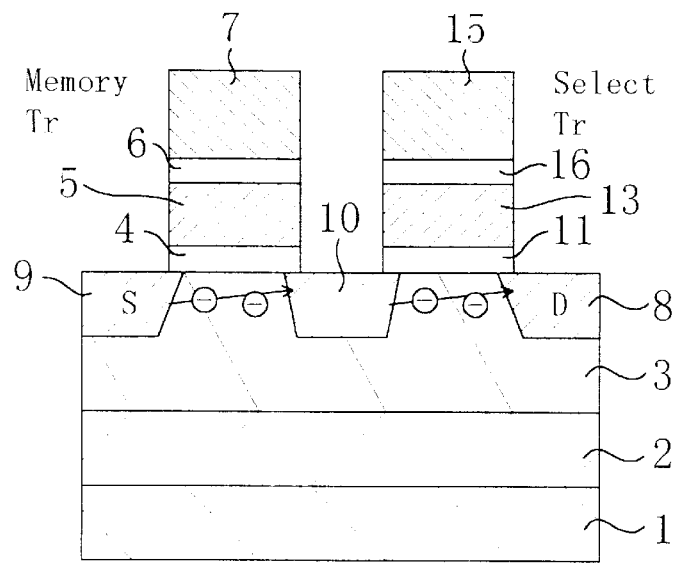

Next, a reading method of the nonvolatile semiconductor memory device of this embodiment will be described. FIG. 12(a) is an electric circuit diagram illustrating voltages applied for reading data from only one memory cell located at the center and selected from the memory cells in the nonvolatile semiconductor memory device of the third embodiment. And FIG. 12(b) is a cross-sectional view illustrating how electrons move during the read operation. The voltages applied for reading as shown in FIG. 12(a) are the same as those applied for reading in the second embodiment (see FIG. 9). As a result of the application of these voltages, in a memory cell in erase state, electrons move and current flows as shown in FIG. 12(b). On the other hand, in the other memory cells in write state, the current does not flow. Based on this current flow, the existence of data stored can be sensed. In this embodiment, a bit line voltage (1 V) is applied only to the intermediate diffusion layer 10 of the selected memory cell during reading. As a result, drain disturb can be advantageously suppressed during a read operation. The "drain disturb" is a phenomenon that data is erroneously written into or erased from a memory cell because of a readout drain voltage applied to a drain.

In this third embodiment, only a method using negative voltages has been described. Alternatively, a driving method not using a negative voltage may also be employed as mentioned in the first embodiment.

As can be understood, the nonvolatile semiconductor memory device of this embodiment can also attain all of the advantages of the conventional nonvolatile semiconductor memory device shown in FIG. 28 over the drain-side FN—FN type flash EEPROM. Specifically, the device of this embodiment 1. improves the reliability;
2. consumes less power during writing and erasing; and
3. lowers the power supply voltage for reading.

In addition, the device of this embodiment can solve the following two disadvantages of the nonvolatile semiconductor memory device shown in FIG. 28:

1. degraded reliability of the lateral interelectrode insulating film; and
2. insufficient breakdown voltage of a select transistor including a sidewall-shaped select gate electrode.

Thus, the nonvolatile semiconductor memory device of this embodiment can provide a highly implementable structure while simultaneously exhibiting satisfactory characteristics.

Specifically, this embodiment is advantageous over the first and second embodiments on the following points. In the nonvolatile semiconductor memory device of the first and second embodiments, positive and negative voltages should be both applied to the bit lines, and therefore, the configuration of a bit line driver is adversely complicated. In particular, since a bit line driver includes a read circuit, an overly complicated bit line driver is disadvantageous to the implementation of a high-speed read operation. By contrast, in this embodiment, the memory transistor is disposed adjacent to the source diffusion layer 9 of a memory cell, and it: is no longer necessary to apply a negative voltage to the bit lines. As a result, the configuration of a bit line driver can be simplified and this embodiment is advantageous to the implementation of a high-speed read operation. However, since a decoder should be provided for a source line, the areas of peripheral circuits adversely increase in this embodiment. Therefore, it is preferable to selectively employ either the structure of this embodiment or the structure of the first and second embodiments based on the intended application of the nonvolatile semiconductor memory device.

Embodiment 4

In the first to the third embodiments, a voltage of −3.5 V is applied to the P-type well and a voltage of 1.5 V is applied to a bit line or a source line during a write operation. As a result, a potential difference of 5 V (=3.5+1.5) is generated between the drain diffusion layer 8 or the source diffusion layer 9 and the P-type well. Thus, a sufficient breakdown voltage should be secured between the diffusion layer and the P-type well. Such a high breakdown voltage possibly bars further miniaturization.

In order to provide a means for solving such a problem, a nonvolatile semiconductor memory device not requiring such a high breakdown voltage between the diffusion layer and the P-type well will be described as the fourth embodiment. In the nonvolatile semiconductor memory device of this embodiment, source lines are disposed electrically independently in parallel to respective bit lines (i.e., vertically to the word lines). In addition, the P-type well 3 are also divided into a plurality of electrically independent regions parallel to respective bit lines.

Figure 13:
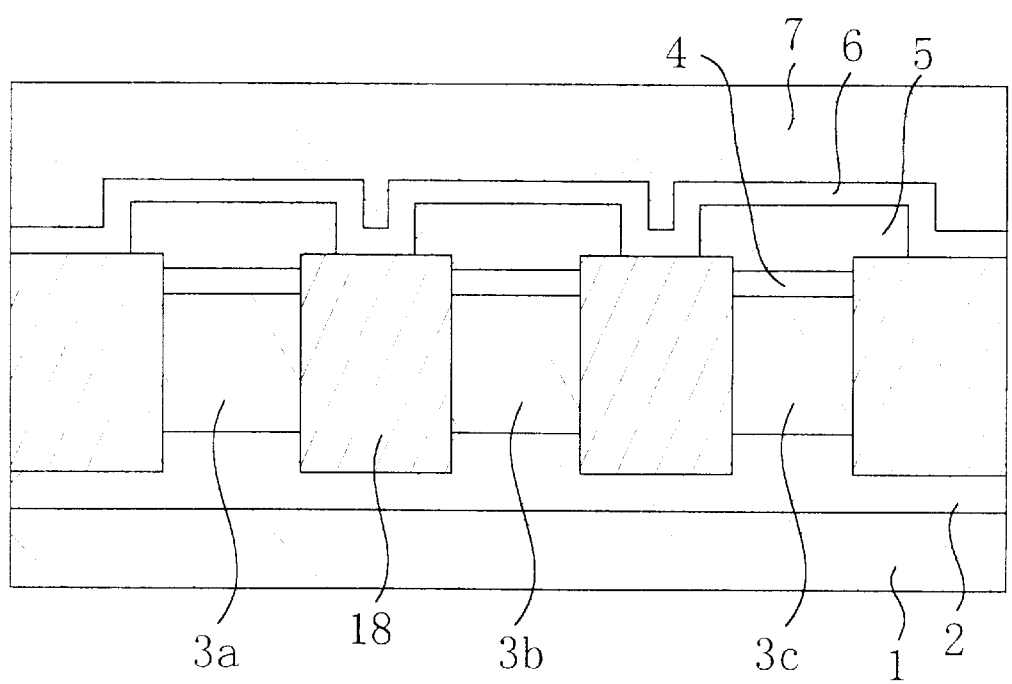
FIG. 13 is a cross-sectional view illustrating the structure of a memory transistor section taken in the direction X in a nonvolatile semiconductor memory device of the fourth embodiment.

FIG. 13 is a cross-sectional view illustrating the structure of a memory transistor section taken in the direction X in the nonvolatile semiconductor memory device of the fourth embodiment. It is noted that the cross section of the memory transistor section taken in the direction Y in the nonvolatile semiconductor memory device of the fourth embodiment is the same as that of the nonvolatile semiconductor memory device of the third embodiment shown in FIG. 10(b). That is to say, the memory transistor is disposed adjacent to the source diffusion layer 9 and the select transistor is disposed adjacent to the drain diffusion layer 8.

As shown in FIG. 13, in this embodiment, a well-isolating film 18 is provided to divide the P-type well 3 into three electrically isolated regions 3a, 3b and 3c in the direction X. And the floating gate electrodes 5 of the respective memory transistors are electrically isolated from each other by the well-isolating film 18. The well-isolating film 18 extends straight in the direction Y. Thus, a plurality of memory cells, located on the same cross section taken in the direction Y, are disposed within the same P-type well 3a, 3b or 3c. In this embodiment, the bottom of the P-type well 3 is electrically isolated from the P-type semiconductor substrate 1 by the deep N-type well 2. Alternatively, an SOI (silicon on insulator) structure may be employed, i.e., the well 3 and the substrate 1 may be isolated from each other by an insulating film.

Figure 14:
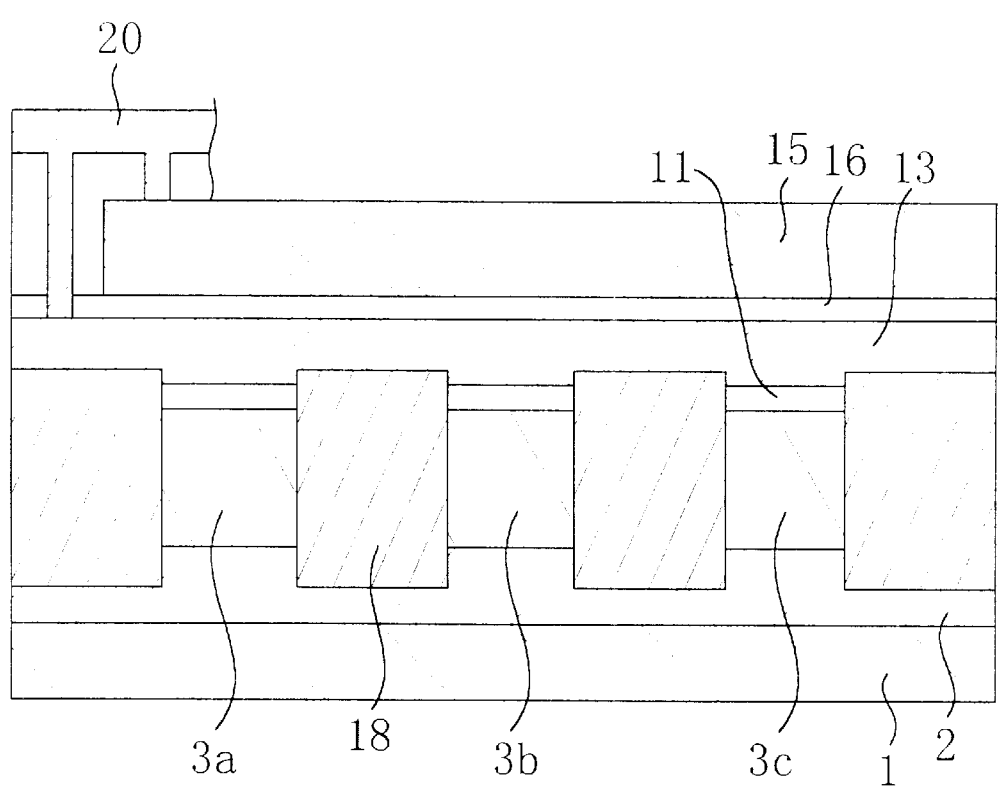
FIG. 14 is a cross-sectional view illustrating the structure of a select transistor section taken in the direction X in the nonvolatile semiconductor memory device of the fourth embodiment.

FIG. 14 is a cross-sectional view illustrating the structure of a select transistor section taken in the direction X in the nonvolatile semiconductor memory device of the fourth embodiment. As shown in FIG. 14, the select gate electrode 13 is continuous among the select transistors adjacent to each other in the direction X, and is electrically short-circuited at regular intervals with the dummy electrode 15 through a metal interconnect 20 or the like on the well-isolating film 18. However, the select gate electrode 13 is not necessarily electrically short-circuited with the dummy electrode 15.

Figure 15:
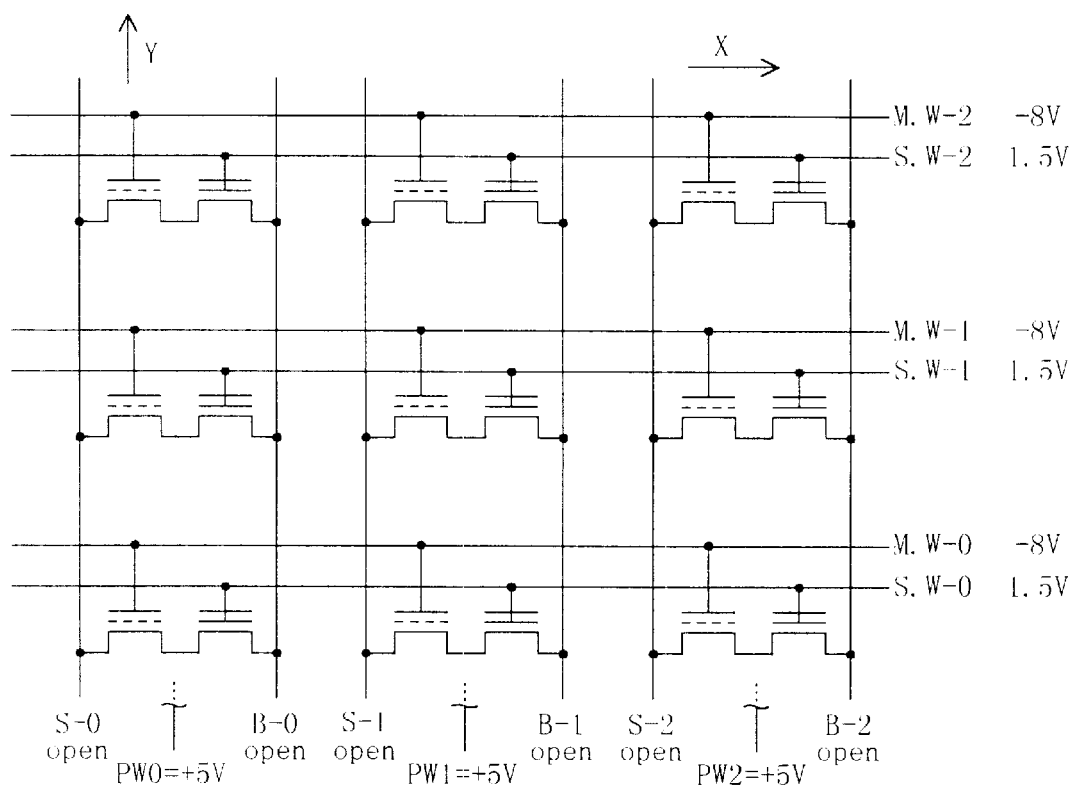
FIG. 15 is an electric circuit diagram illustrating voltages applied for simultaneously erasing data from all the memory cells in the nonvolatile semiconductor memory device of the fourth embodiment.

FIG. 15 is an electric circuit diagram illustrating voltages applied during an erase operation of the nonvolatile semiconductor memory device of the fourth embodiment. In this embodiment, the power supply voltage is assumed to be 1.5 V.

As shown in FIG. 15, the array structure of the nonvolatile semiconductor memory device of the fourth embodiment is the same as that of the third embodiment. However, in this embodiment, a plurality of memory cells arranged in the direction Y are disposed in common within the same one of P-type well regions 3a, 3b or 3c, isolated from each other and provided for the respective memory cells adjacent to each other in the direction X. Also, well contact lines PW-0, 1, 2 are provided to make contact with the respective P-type well regions 3a, 3b and 3c. And different voltages may be applied independently by respective decoders to the P-type well regions 3a, 3b and 3c.

As shown in FIG. 15, a voltage of 5 V is applied to the well contact lines PW-0, 1, 2, connected to the P-type well regions 3a, 3b and 3c, respectively, during an erase operation. Accordingly, the same voltages as those applied in the third embodiment (see FIG. 10(a)) are applied during this erase operation after all. Thus, the description thereof will be omitted herein.

Figure 16:
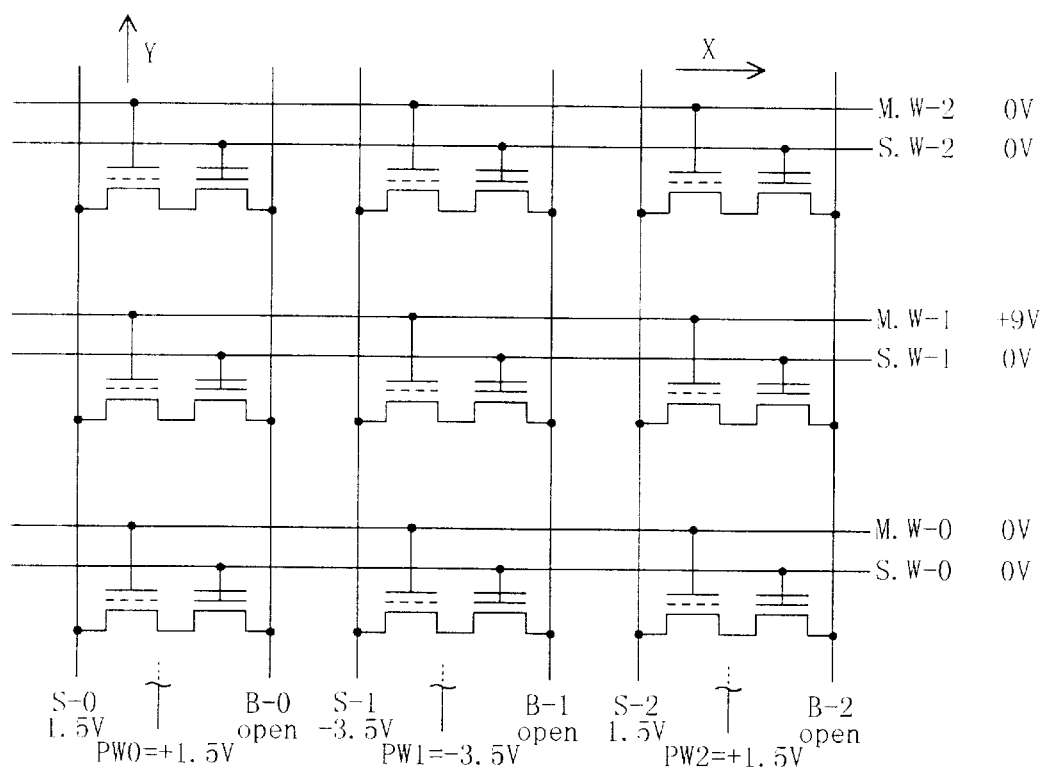
FIG. 16 is an electric circuit diagram illustrating voltages applied for writing data into only one memory cell located at the center and selected from the memory cells in the nonvolatile semiconductor memory device of the fourth embodiment.

Next, a writing method of the nonvolatile semiconductor memory device in this embodiment will be described. FIG. 16 is an electric circuit diagram illustrating voltages applied for writing data into only one memory cell located at the center and selected from the memory cells in the nonvolatile semiconductor memory device of the fourth embodiment. As shown in FIG. 16, a voltage of +9 V is applied to the memory word line M.W-1 connected to the control gate electrode of the selected memory cell. A voltage of 0 V is applied to the select word line S.W-1 connected to the select gate electrode of the selected memory cell. A voltage of −3.5 V is applied to the source line S-1 connected to the source diffusion layer of the selected memory cell. And a voltage of −3.5 V is applied to the well contact line PW-1 connected to the P-type well 3b of the selected memory cell. As a result, the potential difference between the control gate electrode 7 and the surface of the channel is 12.5 V at the selected memory cell. Consequently, in the same way as in FIG. 11(b), tunneling current flows from the entire surface region of the channel of the memory transistor into the floating gate electrode 5 of the memory transistor, whereby electrons are injected into the floating gate electrode 5. In this case, the threshold voltage of the memory transistor is about 1 V.

Also, in order to prevent data from being erroneously written into the non-selected memory cells, a voltage of 0 V is applied to the other memory word lines M.W-0, 2 and select word lines S.W-0, 2, and a voltage of 1.5 V is applied to the other source lines S-0, 2 and well contact lines PW-0, 2. As a result, the potential difference between the control gate electrode 7 and the surface of the channel can be no greater than 7.5 V at the memory transistors of the non-selected memory cells. Consequently, it is possible to prevent the data from being erroneously written into the non-selected memory cells. It is noted that the bit lines B-0, 1, 2 are all opened in this embodiment, thereby simplifying the control operation as much as possible.

The nonvolatile semiconductor memory device of this embodiment can control in this manner the potential in the P-type well for non-selected memory cells on a bit line basis. Accordingly, since the potential difference between the source diffusion layer 9 (or the drain diffusion layer 8) and the P-type well 3 can be 0 V, it is no longer necessary to secure a high breakdown voltage for this part.

Figure 17:
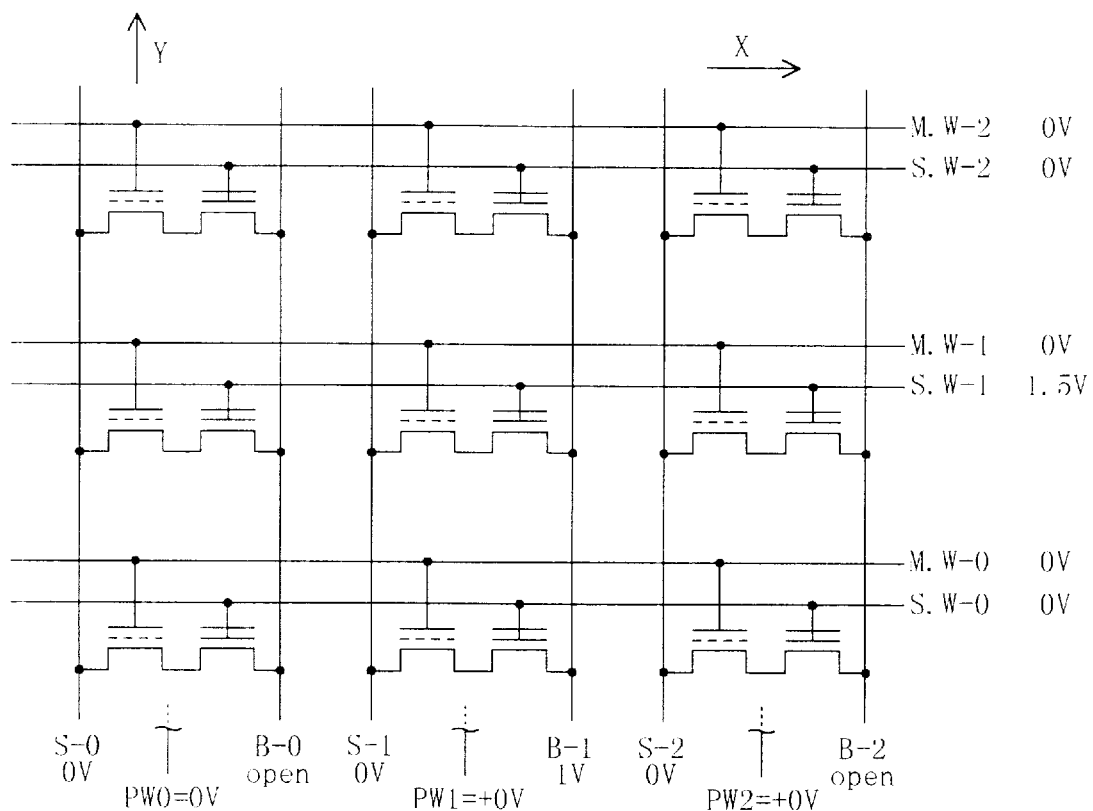
FIG. 17 is an electric circuit diagram illustrating voltages applied for reading data from only one memory cell located at the center and selected from the memory cells in the nonvolatile semiconductor memory device of the fourth embodiment.

Next, a reading method of the nonvolatile semiconductor memory device of this embodiment will be described. FIG. 17 is an electric circuit diagram illustrating voltages applied for reading data from only one memory cell located at the center and selected from the memory cells in the nonvolatile semiconductor memory device of the fourth embodiment. The voltages applied for reading as shown in FIG. 17 are the same as those applied for reading in the third embodiment (see FIG. 12(a)), because a voltage of 0 V is applied to the respective well contact lines PW-0, 1, 2. As a result, in a memory cell in erase state, electrons move in the same way as in the third embodiment shown in FIG. 12(b).

In this fourth embodiment, only a method using negative voltages has been described. Alternatively, a driving method not using a negative voltage may also be employed as mentioned in the first embodiment.

As can be understood, the nonvolatile semiconductor memory device of this embodiment can also attain all of the advantages of the conventional nonvolatile semiconductor memory device shown in FIG. 28 over the drain-side FN—FN type flash EEPROM. Specifically, the device of this embodiment 1. improves the reliability;
2. consumes less power during writing and erasing; and
3. lowers the power supply voltage for reading.

In addition, the device of this embodiment can solve the following two disadvantages of the nonvolatile semiconductor memory device shown in FIG. 28:

1. degraded reliability of the lateral interelectrode insulating film; and
2. insufficient breakdown voltage of a select transistor including a sidewall-shaped select gate electrode.

Therefore, the nonvolatile semiconductor memory device of this embodiment can provide a highly implementable structure while simultaneously exhibiting satisfactory characteristics.

Specifically, this embodiment is advantageous over the first, second and third embodiments on the following points. In the first, second and third embodiments, since a potential difference of about 5 V is generated between the source diffusion layer 9 (or the drain diffusion layer 8) and the P-type well 3, a high breakdown voltage should be secured between the diffusion layer and the well. Accordingly, if the design rule should be defined at as small as about 0.2 μm or less, problems happen. By contrast, in this embodiment, source lines are disposed electrically independently in parallel to respective bit lines (i.e., vertically to the word lines) and the P-type well 3 are also divided into a plurality of electrically isolated regions parallel to respective bit lines. Accordingly, in this embodiment, it is easy to set the potential difference between the source diffusion layer 9 (or the drain diffusion layer 8) and the P-type well at 0 V. Therefore, this embodiment is advantageous to miniaturization requiring a design rule of 0.2 μm or less.

In a memory cell of this embodiment, a memory transistor is disposed adjacent to the source diffusion layer 9, while a select transistor is disposed adjacent to the drain diffusion layer 8. Alternatively, these transistors may be disposed in an opposite fashion.

In this embodiment, the erase operation is performed by ejecting electrons out of the floating gate electrode 5 (the threshold voltage VT of a memory cell is set at −1.5 V) and the write operation is performed by injecting electrons into the floating gate electrode 5 (VT=1.0 V). However, the present invention is not limited to such an embodiment.

Figure 18:
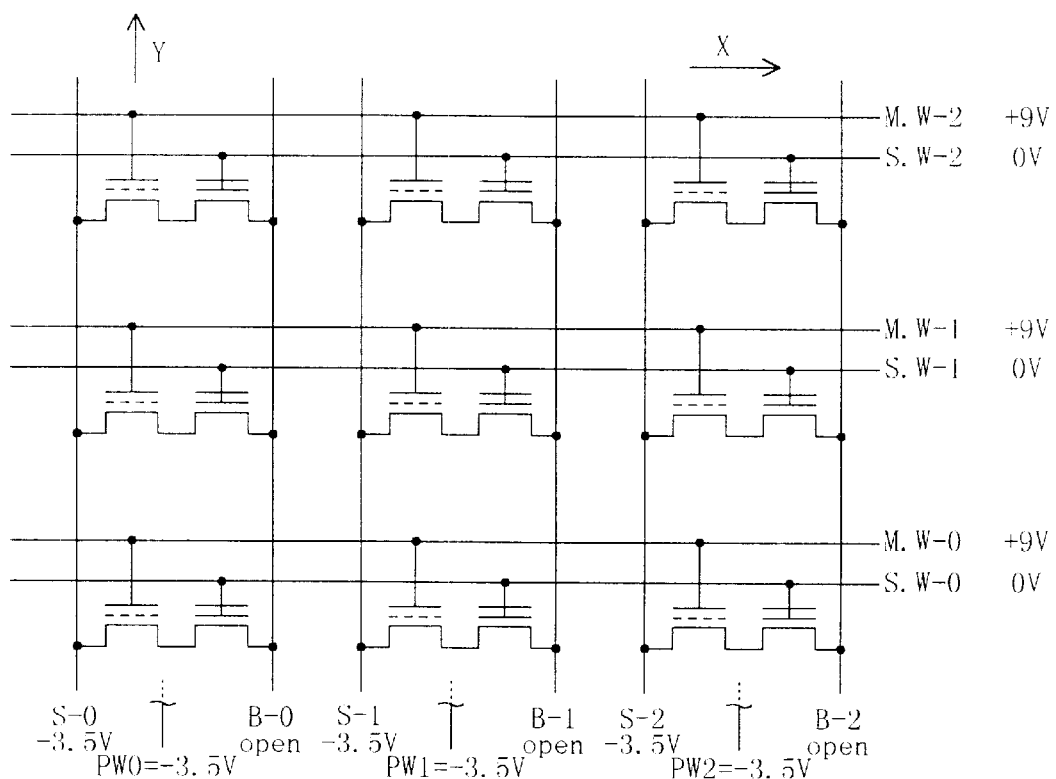
FIG. 18 is an electric circuit diagram illustrating voltages applied for performing an erase operation by injecting electrons into the floating gate electrode in a modified embodiment of the fourth embodiment.
Figure 19:
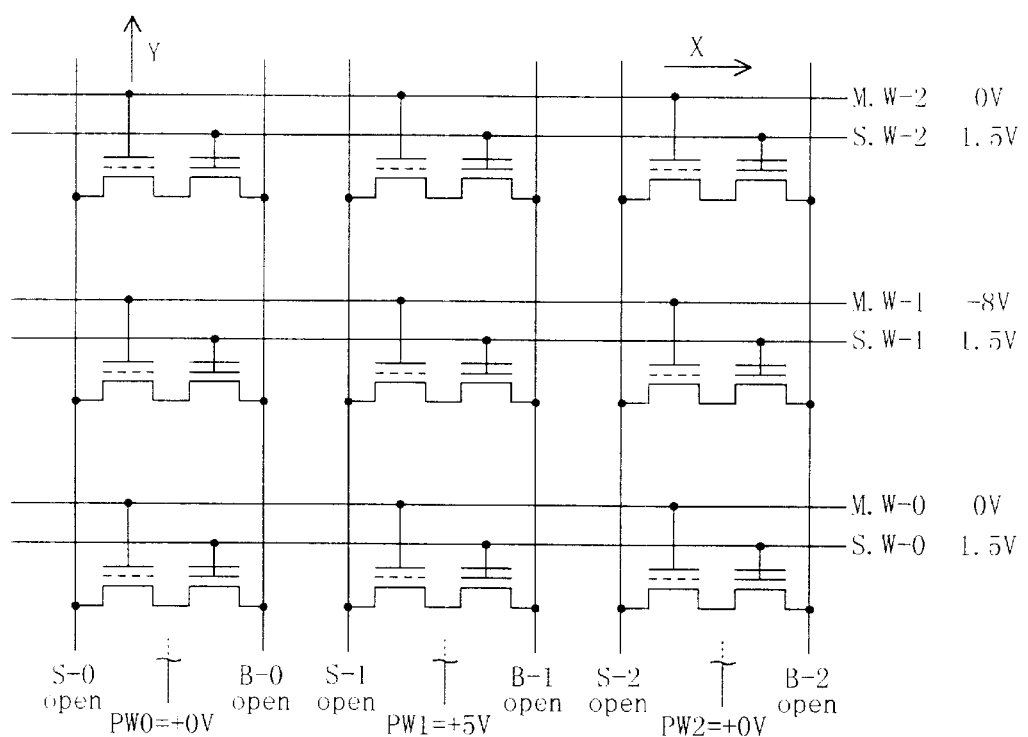
FIG. 19 is an electric circuit diagram illustrating voltages applied for performing a write operation by ejecting electrons out of the floating gate electrode in the modified embodiment of the fourth embodiment.

FIG. 18 is an electric circuit diagram illustrating voltages applied for performing an erase operation by injecting electrons into the floating gate electrode 5. And FIG. 19 is an electric circuit diagram illustrating voltages applied for performing a write operation by ejecting electrons out of the floating gate electrode 5. As can be understood, by enabling an electrically independent control over the P-type well 3 on a bit line basis, the threshold voltages defined for writing and erasing may be inverted. The effects attained by this inversion will be described in the next embodiment.

Embodiment 5

In the first to the fourth embodiments, a memory transistor and a select transistor are both required. Specifically, in the first embodiment, a select transistor should be provided adjacent to the source region of a memory cell so that the source lines disposed along the word lines may be opened. In the second, third and fourth embodiments, the operation of simultaneously erasing data from a plurality of memory cells is performed by ejecting electrons out of the floating gate electrode 5 (the threshold voltage decreases). Thus, a select transistor should also be provided (either in the source region or in the drain region) to avoid the problem of excessive erasure. Thus, the nonvolatile semiconductor memory device of the foregoing embodiments is disadvantageous over the conventional drain-side FN—FN type flash EEPROM shown in FIG. 24 in that the area occupied by a memory cell increases in these embodiments.

In order to provide a means for solving this problem, a nonvolatile semiconductor memory device, which can avoid the increase in area of a memory cell, will be described as the fifth embodiment. In the nonvolatile semiconductor memory device of this embodiment, source lines are also disposed electrically independently in parallel to respective bit lines (i.e., vertically to the word lines). In addition, the P-type well 3 are also divided into a plurality of electrically isolated regions parallel to the respective bit lines. Furthermore, a memory cell of this embodiment includes only a memory transistor, not a select transistor.

Figure 20:
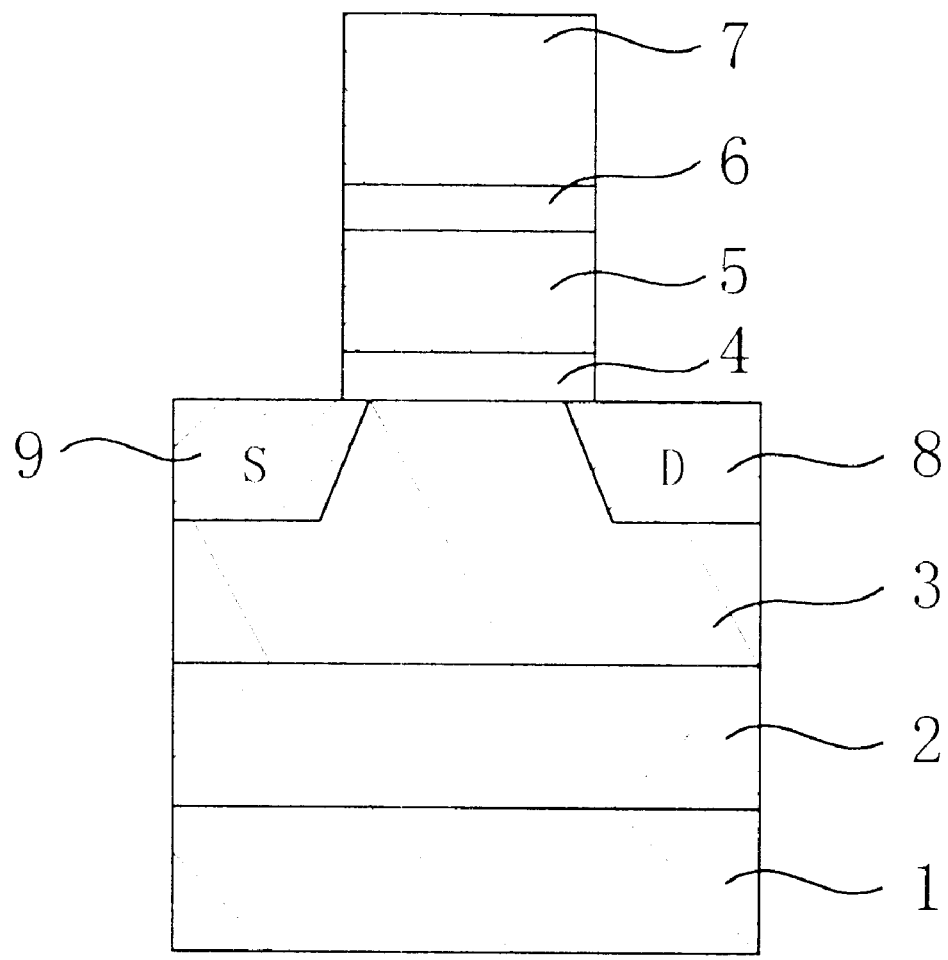
FIG. 20 is a cross-sectional view illustrating the structure of a memory cell taken in the direction Y in a non-volatile semiconductor memory device of the fifth embodiment.

FIG. 20 is a cross-sectional view illustrating the structure of a memory transistor section taken in the direction Y in the nonvolatile semiconductor memory device of the fifth embodiment. As shown in FIG. 20, the memory cell of this embodiment includes only the same components (identified by the same reference numerals) as the nonvolatile semiconductor memory device of the first embodiment shown in FIG. 1, and the description thereof will be omitted herein. As can seen, the memory cell of this embodiment includes only the memory transistor and is not provided with any select transistor.

Figure 21:
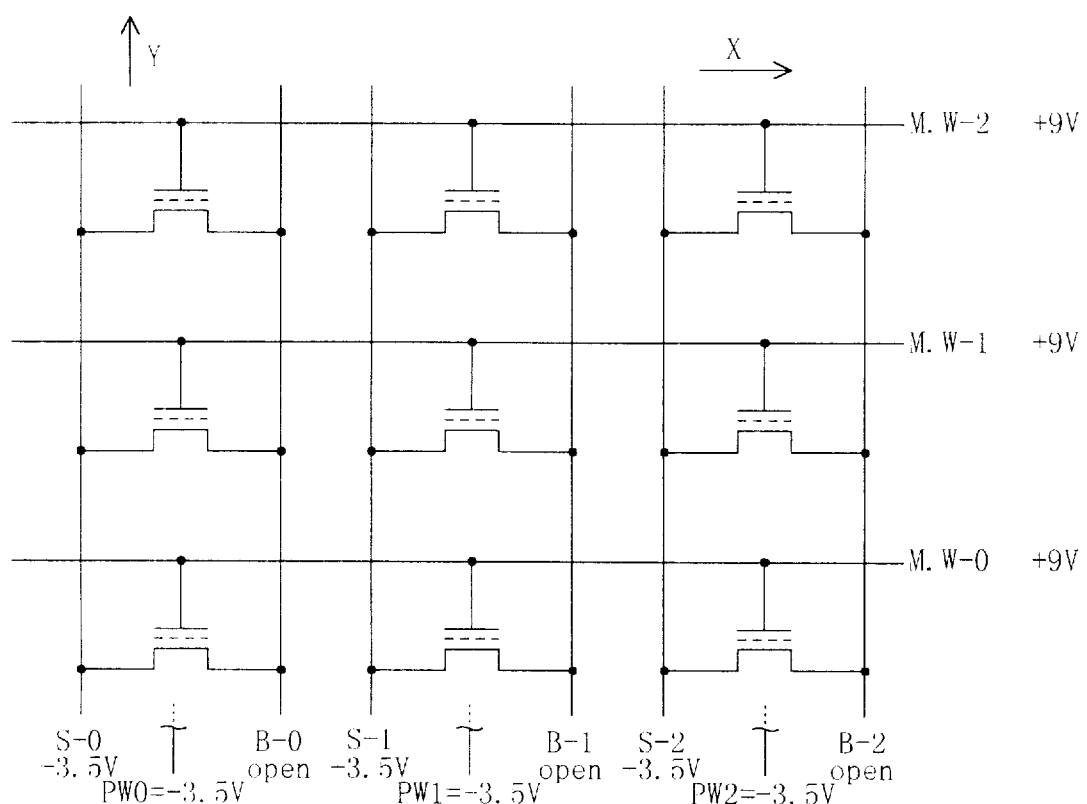
FIG. 21 is an electric circuit diagram illustrating voltages applied for simultaneously erasing data from all the memory cells in the nonvolatile semiconductor memory device of the fifth embodiment.

FIG. 21 is an electric circuit diagram illustrating voltages applied during an erase operation of the nonvolatile semiconductor memory device of the fifth embodiment. In this embodiment, the power supply voltage is assumed to be 1.5 V.

First, with reference to FIG. 21, the array structure of the nonvolatile semiconductor memory device in this embodiment will be described. As shown in FIG. 21, each memory word line M.W-0, 1, 2 interconnects the control gate electrodes 7 of memory transistors arranged on the same row in the direction X. Each source line S-0, 1, 2 interconnects the source diffusion layers 9 of memory cells arranged on the same column in the direction Y. And each bit line B-0, 1, 2 interconnects the drain diffusion layers 8 of memory cells arranged on the same column in the direction Y.

In this manner, the source lines S-0, 1, 2 and the bit lines B-0, 1, 2 are disposed vertically to the word lines for memory cells (i.e., the memory word lines M.W-0, 1, 2). Also, the source lines S-0, 1, 2 are provided for the respective bit lines B-0, 1, 2 and are electrically isolated from each other between memory cells adjacent to each other in the direction X. In addition, in the same way as in the fourth embodiment, the P-type well 3 is divided into respective electrically isolated regions between memory cells adjacent to each other in the direction X. And the potentials in the P-type well regions 3 are controllable by using decoders for well contact lines PW-0, 1, 2.

Next, an erasing method of the nonvolatile semiconductor memory device in this embodiment will be described. FIG. 21 illustrates the voltages applied for simultaneously erasing data from all of the nine memory cells illustrated. As shown in FIG. 21, a voltage of +9 V is applied to all the memory word lines M.W-0, 1, 2 and a voltage of −3.5 V is applied to all the well contact lines Pw-0, 1, 2. As a result, the potential difference between the control gate electrode 7 and the surface of the channel is 12.5 V at every memory transistor. Consequently, tunneling current flows from the entire surface region of the channel into the floating gate electrode 5 at the memory transistor, whereby electrons are injected into the floating gate electrode 5. In this case, the threshold voltage of the memory transistor is about 2.0 V.

Figure 22:
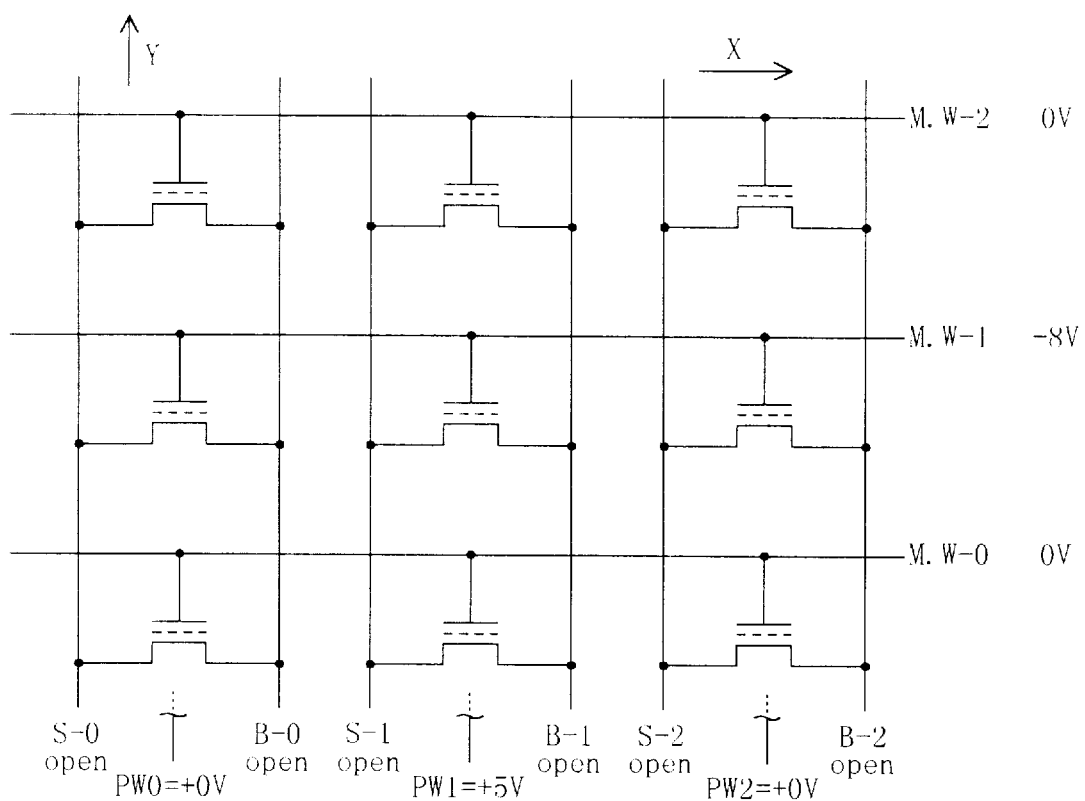
FIG. 22 is an electric circuit diagram illustrating voltages applied for writing data into only one memory cell located at the center and selected from the memory cells in the nonvolatile semiconductor memory device of the fifth embodiment.

Next, a writing method of the nonvolatile semiconductor memory device in this embodiment will be described. FIG. 22 is an electric circuit diagram illustrating voltages applied for writing data into only one memory cell located at the center and selected from the nine memory cells in the nonvolatile semiconductor memory device of this embodiment. As shown in FIG. 22, a voltage of −8 V is applied to the memory word line M.W-1 connected to the control gate electrode of a selected memory cell. And a voltage of 5 V is applied to the well contact line PW-1 connected to the P-type well of the selected memory cell. As a result, the potential difference between the control gate electrode 7 and the surface of the channel is 13 V at the memory transistor of the selected memory cell. Consequently, tunneling current flows from the floating gate electrode 5 into the entire surface of the channel, whereby electrons are ejected out of the floating gate electrode 5. In this case, the threshold voltage of the memory transistor is about 0.5 V.

Also, in order to prevent data from being erroneously written into the non-selected memory cells, a voltage of 0 V is applied to the other memory word lines M.W-0, 2 and well contact lines PW-0, 2. As a result, the potential difference between the control gate electrode 7 and the surface of the channel can be no greater than 8 V at the memory transistors of the non-selected memory cells. Consequently, it is possible to prevent the data from being erroneously written into non-selected memory cells. It is noted that all the bit lines B-0, 1, 2 and source lines S-0, 1, 2 may be either opened (about 0 V) or set at respective potentials equal to those of the P-type well regions connected to the bit lines and source lines.

By making the potentials in the P-type well regions 3 at the non-selected memory cells independently controllable, the threshold voltage can be in a controllable write state on a bit-by-bit basis during a write operation performed by ejecting electrons (threshold voltage decreases). Accordingly, a memory cell can include only a memory transistor while avoiding the problem of excessive erasure.

Figure 23:
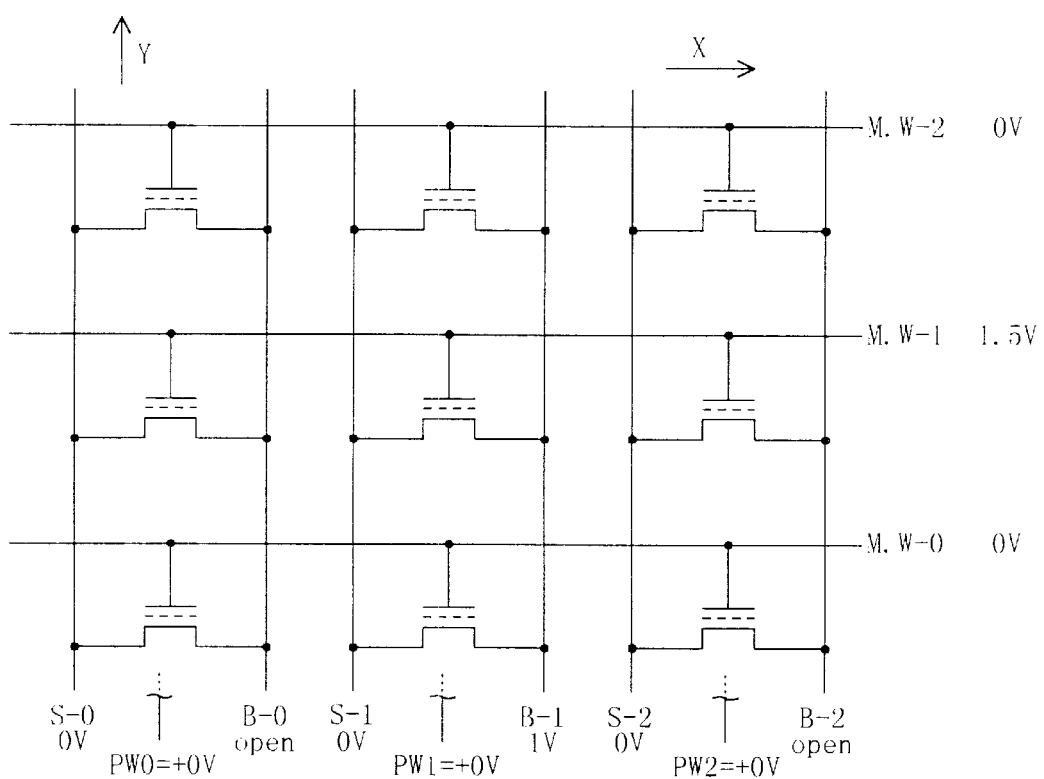
FIG. 23 is an electric circuit diagram illustrating voltages applied for reading data from only one memory cell located at the center and selected from the memory cells in the nonvolatile semiconductor memory device of the fifth embodiment.

Next, a reading method of the nonvolatile semiconductor memory device of this embodiment will be described. FIG. 23 is an electric circuit diagram illustrating voltages applied for reading data from only one memory cell located at the center and selected from the nine memory cells in the nonvolatile semiconductor memory device of this embodiment. As shown in FIG. 23, a voltage of 1.5 V is applied to the memory word line M.W-1 connected to the control gate electrode of the selected memory cell, while a voltage of 0 V is applied to the other memory word lines M-0, 2. A voltage of 1 V is applied to the bit line B-1 connected to the drain diffusion layer of the selected memory cell, while the other bit lines B-0, 2 are opened. And a voltage of 0 V is applied to all the well contact lines PW-0, 1, 2. As a result, while the memory transistor of the selected memory cell is in erase state (VT=2 V), no current flows. On the other hand, while the memory transistor of the selected memory cell is in write state (VT=0.5 V), the current does flow. Based on this current flow, the existence of data stored can be sensed.

In this fifth embodiment, only a method using negative voltages has been described. Alternatively, a driving method not using a negative voltage may also be employed as mentioned in the first embodiment.

As can be understood, the nonvolatile semiconductor memory device of this embodiment can also attain all of the advantages of the conventional nonvolatile semiconductor memory device shown in FIG. 28 over the drain-side FN—FN type flash EEPROM. Specifically, the device of this embodiment 1. improves the reliability;
2. consumes less power during writing and erasing; and
3. lowers the power supply voltage for reading.

In addition, the device of this embodiment can solve the following two disadvantages of the nonvolatile semiconductor memory device shown in FIG. 28:

1. degraded reliability of the lateral interelectrode insulating film; and
2. insufficient breakdown voltage of a select transistor including a sidewall-shaped select gate electrode.

Therefore, the nonvolatile semiconductor memory device of this embodiment can provide a highly implementable structure while simultaneously exhibiting satisfactory characteristics.

In particular, since the nonvolatile semiconductor memory device of this embodiment does not include any select transistor but includes only a memory transistor, the area occupied by a single memory cell can be reduced as compared with the nonvolatile semiconductor memory device shown in FIG. 28. However, in this embodiment, circuit designing technologies are required for controlling the write depth (threshold voltage) of a memory cell bit by bit to be distributed within a narrow range (e.g., from 0.6 V to 0.8 V).

Figure 33:
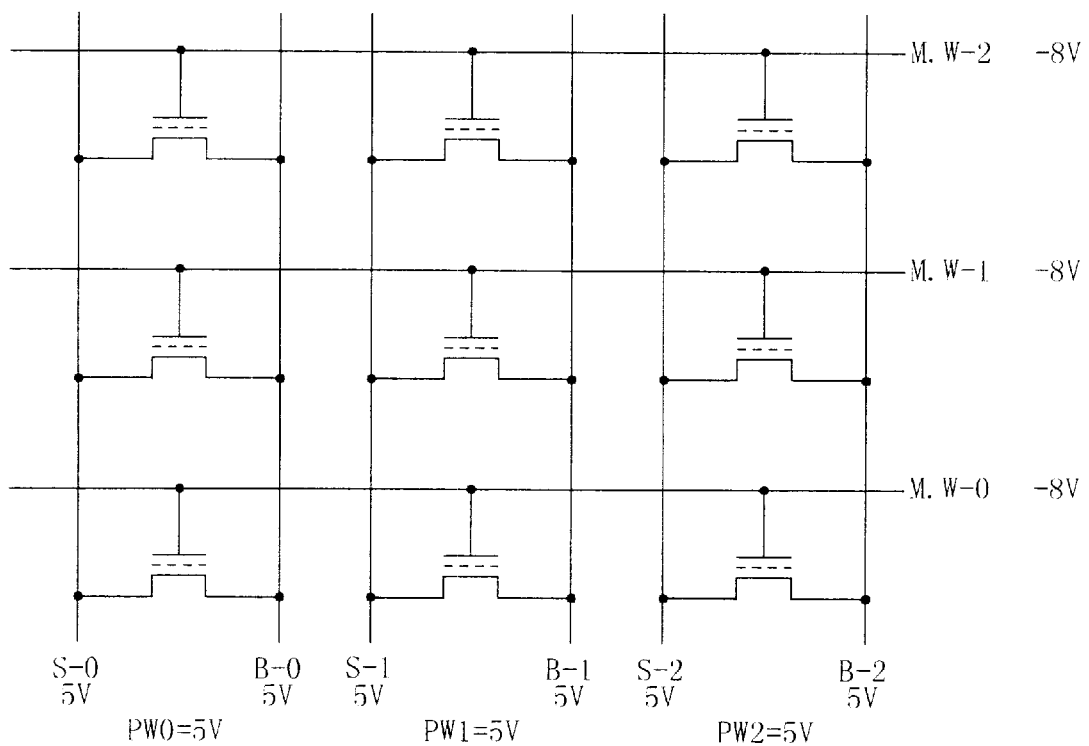
FIG. 33 is an electric circuit diagram illustrating voltages applied for performing an erase operation in a conventional nonvolatile semiconductor memory device.
Figure 34:
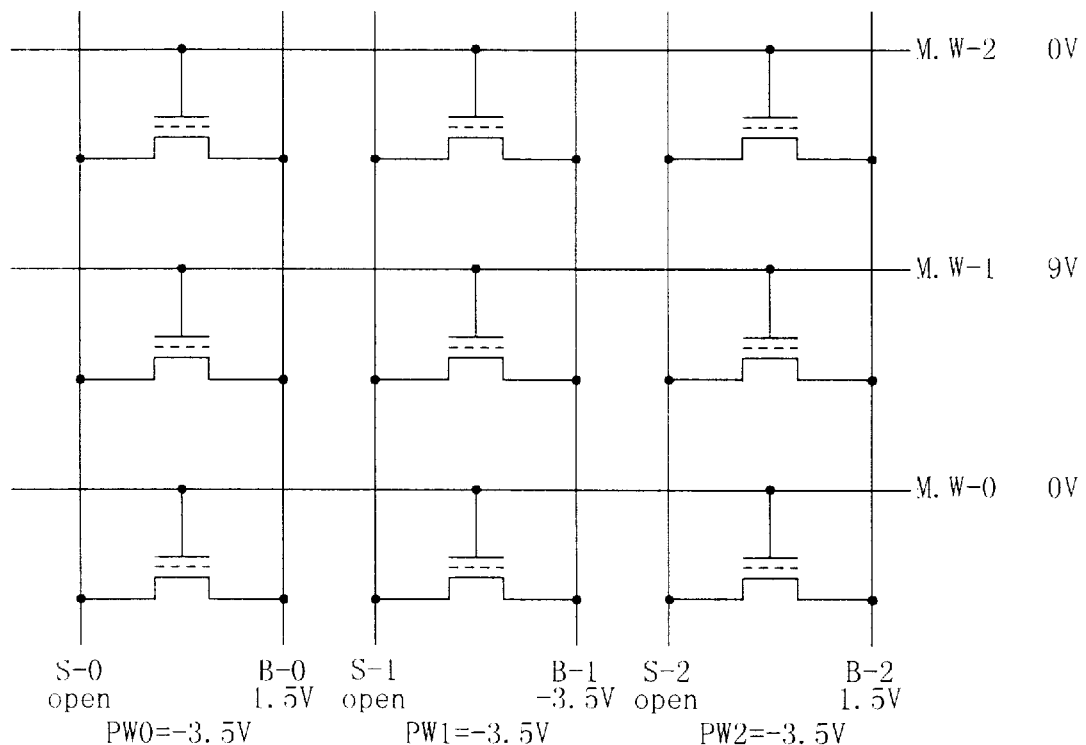
FIG. 34 is an electric circuit diagram illustrating voltages applied for performing a write operation in the conventional nonvolatile semiconductor memory device.
Figure 35:
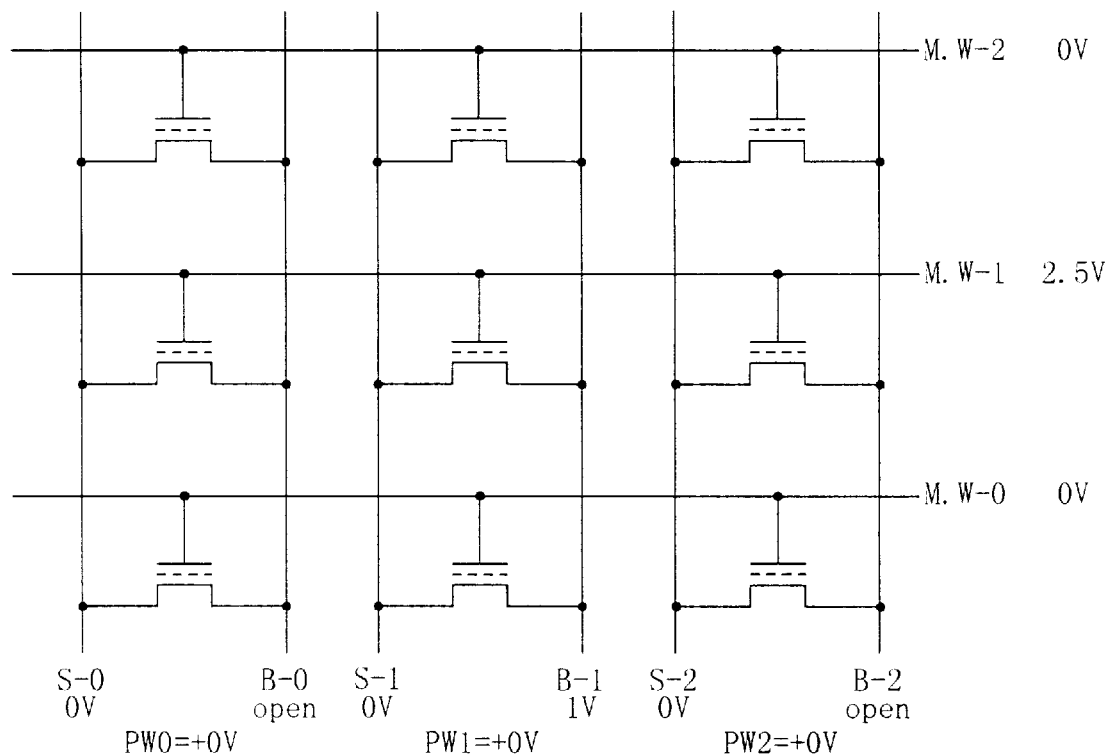
FIG. 35 is an electric circuit diagram illustrating voltages applied for performing a read operation in the conventional nonvolatile semiconductor memory device.

Hereinafter, the difference between the fifth embodiment and the analogous prior art will be described. FIGS. 33 through 35 are electric circuit diagrams illustrating voltages applied for performing erase, write and read operations, respectively, in a conventional nonvolatile semiconductor memory device disclosed in Japanese Laid-Open Publication No. 8-279566. The structure of a memory cell in the nonvolatile semiconductor memory device described in this publication is similar to that of the memory cell in the fifth embodiment shown in FIG. 20. However, the memory cell described in the publication is configured to apply an equal potential to all the wells provided for the respective columns, not to independently control the potentials in the respective well regions as in the fifth embodiment. This is because, in the memory cells of the publication, the wells are provided for the respective columns just to suppress leakage current between adjacent columns. Comparing the fifth embodiment to the technology disclosed in the publication, the threshold voltages and the operations for writing and erasing are defined in mutually opposite manners.

Figure 32A:
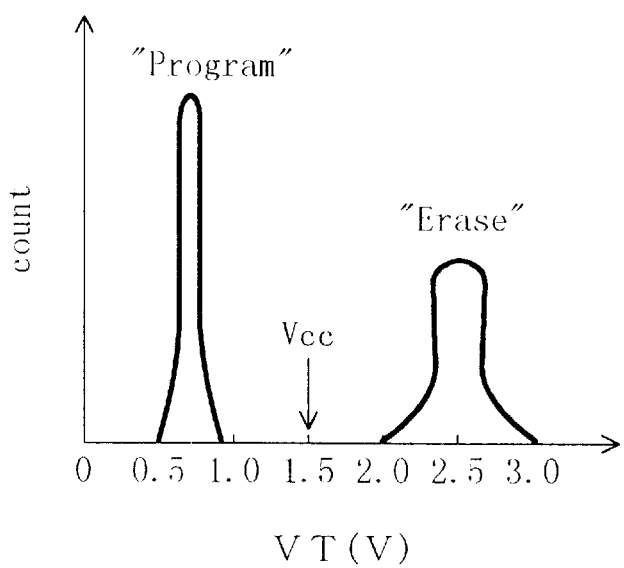
FIG. 32(a) is a graph illustrating respective distributions of threshold voltages after write and erase operations have been performed in a nonvolatile semiconductor memory device of the present invention.
Figure 32B:
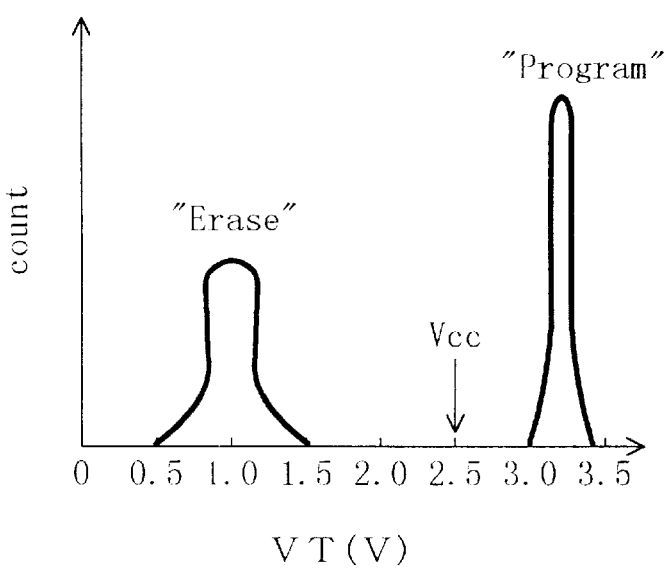
FIG. 32(b) is a graph illustrating respective distributions of threshold voltages after write and erase operations have been performed in a conventional nonvolatile semiconductor memory device.

FIG. 32(*a*) is a graph illustrating the distributions of threshold voltages of a memory cell after write and erase operations have been performed by the memory cell of this embodiment. And FIG. 32(*b*) is a graph illustrating the distributions of threshold voltages of a memory cell after write and erase operations have been performed by the memory cell of the above identified publication. As shown in FIG. 32(*a*), the threshold voltage in erase state (where the threshold voltage is high) is in the range from 2.0 V to 3.0 V in this embodiment. Thus, it can be understood that the threshold voltage in the erase state in this embodiment is much lower than the threshold voltage of 3.0 V to 3.5 V in the write state (where the threshold voltage is high) in accordance with the technology disclosed in the publication. On the other hand, the lower threshold voltages are approximately equal to each other in both this embodiment and the prior art.

That is to say, in order to realize an operation at an even lower voltage, the distribution of lower threshold voltages should be controlled to have a narrower range. And for this purpose, the write or erase operation should be controlled on a bit-by-bit basis. In this embodiment, since the respective well regions are coded, it is possible to decrease only the threshold voltage of a particular memory cell located at the intersection between a well region and a word line, and therefore, the operation can be controlled on a bit-by-bit basis. However, in accordance with the technology disclosed in the publication, control cannot be performed but to set the potentials in the respective wells at an equal value, and it is difficult to decrease only the threshold voltage of a particular bit. Thus, even though an operation at a voltage lower than 2.5 V is impossible in accordance with the technology disclosed in the publication, an operation at 1.5 V is enabled in accordance with this embodiment. That is a prominent effect attainable only by this embodiment.

In other words, the technology disclosed in the above-identified publication can solve two out of the three conventional problems, i.e., (1) improvement of reliability and (2) reduction of power consumption during writing. However, it is difficult for the prior art to solve the remaining problem of performing a read operation at a lower voltage.

What is claimed is:

1. A nonvolatile semiconductor memory device having an array of memory cells arranged in columns and rows over a well region of a semiconductor substrate, each said memory cell comprising:

a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film;

a select transistor including a second gate insulating film formed on the semiconductor substrate, and a select gate electrode formed on the second gate insulating film, the select transistor being disposed on the semiconductor substrate to be spaced apart from the memory transistor;

an intermediate diffusion layer formed in a region of the semiconductor substrate and located between the memory transistor and the select transistor; and source/drain diffusion layers formed in the semiconductor substrate to interpose a region underlying the memory transistor, a region underlying the select transistor and the intermediate diffusion layer therebetween, wherein the source/drain diffusion layers and the intermediate diffusion layer have an equal dopant concentration.

2. The device of claim 1, wherein the select transistor is disposed between the source diffusion layer and the intermediate diffusion layer, while the memory transistor is disposed between the drain diffusion layer and the intermediate diffusion layer, and wherein the device further comprises:

a plurality of memory word lines, each said memory word line interconnecting the control gate electrodes of the respective memory transistors in the memory cells arranged on the same row and associated with the memory word line;

a plurality of select word lines, each said select word line interconnecting the select gate electrodes of the respective select transistors in the memory cells arranged on the same row and associated with the select word line;

a plurality of source lines, each said source line interconnecting the source diffusion layers of the memory cells arranged on the same row and associated with the source line; and a plurality of bit lines, each said bit line interconnecting the drain diffusion layers of the memory cells arranged on the same column and associated with the bit line.

3. The device of claim 1, wherein the select transistor is disposed between the source diffusion layer and the intermediate diffusion layer, while the memory transistor is disposed between the drain diffusion layer and the intermediate diffusion layer, and wherein the device further comprises:

a plurality of memory word lines, each said memory word line interconnecting the control gate electrodes of the respective memory transistors in the memory cells arranged on the same row and associated with the memory word line;

a plurality of select word lines, each said select word line interconnecting the select gate electrodes of the respective select transistors in the memory cells arranged on the same row and associated with the select word line;

a plurality of source lines, each said source line inter connecting the source diffusion layers of the memory cells arranged on the same column and associated with the source line; and a plurality of bit lines, each said bit line interconnecting the drain diffusion layers of the memory cells arranged on the same column and associated with the bit line.

4. The device of claim 1, wherein the select transistor is disposed between the drain diffusion layer and the intermediate diffusion layer, while the memory transistor is disposed between the source diffusion layer and the intermediate diffusion layer, and wherein the device further comprises:

a plurality of memory word lines, each said memory word line interconnecting the control gate electrodes of the respective memory transistors in the memory cells arranged on the same row and associated with the memory word line;

a plurality of select word lines, each said select word line interconnecting the select gate electrodes of the respective select transistors in the memory cells arranged on the same row and associated with the select word line;

a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

5. The device of claim 1, wherein the well region is divided into a plurality of electrically isolated regions corresponding to the respective columns.

6. The device of claim 5, wherein the select transistor is disposed between the source diffusion layer and the intermediate diffusion layer, while the memory transistor is disposed between the drain diffusion layer and the intermediate diffusion layer, and wherein the device further comprises:

a plurality of memory word lines, each said memory word line interconnecting the control gate electrodes of the respective memory transistors in the memory cells arranged on the same row and associated with the memory word line;

a plurality of select word lines, each said select word line interconnecting the select gate electrodes of the respective select transistors in the memory cells arranged on the same row and associated with the select word line;

a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

7. The device of claim 5, wherein the select transistor is disposed between the drain diffusion layer and the intermediate diffusion layer, while the memory transistor is disposed between the source diffusion layer and the intermediate diffusion layer, and wherein the device further comprises:

a plurality of memory word lines, each said memory word line interconnecting the control gate electrodes of the respective memory transistors in the memory cells arranged on the same row and associated with the memory word line;

a plurality of select word lines, each said select word line interconnecting the select gate electrodes of the respective select transistors in the memory cells arranged on the same row and associated with the select word line;

a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

8. The device of claim 1, wherein the second gate insulating film of the select transistor is formed out of an insulating film formed substantially simultaneously with the first gate insulating film of the memory transistor and has a uniform thickness at least in a gate longitudinal direction, and wherein the select gate electrode of the select transistor is formed out of a first conductor film deposited substantially simultaneously with the floating gate electrode of the memory transistor, and wherein the select transistor further comprises:

a second interelectrode insulating film formed on the select gate electrode out of an insulating film substantially simultaneously with the interelectrode insulating film of the memory transistor; and a dummy electrode formed on the second interelectrode insulating film out of a second conductor film deposited substantially simultaneously with the control gate electrode of the memory transistor.

9. The device of claim 1, wherein the drain diffusion layer, the intermediate diffusion layer and the source diffusion layer are formed substantially simultaneously by introducing an impurity into the semiconductor substrate.

10. The device of claim 5, further comprising:

a plurality of laterally isolating regions, formed along the columns and between the respective well regions and made of a semiconductor or an insulator of an opposite conductivity type to that of the well regions, for laterally isolating the respective well regions from each other; and a plurality of vertically isolating regions, each said vertically isolating region being interposed between an associated one of the well regions and the semiconductor substrate and made of a semiconductor or an insulator of the opposite conductivity type to that of the well regions.

11. The device of claim 1, wherein the second gate insulating film of the select transistor and the first gate insulating film of the memory transistor are formed at the same thickness during the same process step such that a potential difference between the select gate electrode of the select transistor and the well region causes an electric field of 5 MV/cm or less to be applied to the second gate insulating film.

12. The device of claim 8, wherein the select gate electrode is continuous among the select transistors adjacent to each other, and is electrically short-circuited with the dummy electrode at regular intervals.

13. A nonvolatile semiconductor memory device having an array of memory cells arranged in columns and rows over a semiconductor substrate, each said memory cell comprising:

a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film; and source/drain diffusion layers formed in the semiconductor substrate to interpose a region underlying the memory transistor therebetween, wherein some of the memory cells which are arranged in columns are disposed on respective well regions, each of the well regions being divided into a plurality of electrically isolated regions parallel to respective bit lines, the well regions have potentials which are controllable independently of each other, and source lines are disposed electrically independently in parallel to the respective bit lines.

14. The device of claim 13, further comprising:

a plurality of memory word lines, each said memory word line interconnecting the control gate electrodes of the respective memory transistors in the memory cells arranged on the same row and associated with the memory word line;

a plurality of source lines, each said source line interconnecting the source diffusion layers of the memory cells arranged on the same column and associated with the source line; and a plurality of bit lines, each said bit line interconnecting the drain diffusion layers of the memory cells arranged on the same column and associated with the bit line.

15. The device of claim 13, wherein the drain diffusion layer and the source diffusion layer are formed substantially simultaneously by introducing an impurity into the semiconductor substrate.

16. The device of claim 13, further comprising:

a plurality of laterally isolating regions, formed along the columns and between the respective well regions and made of a semiconductor or an insulator of an opposite conductivity type to that of the well regions, for laterally isolating the respective well regions from each other; and a plurality of vertically isolating regions, each said vertically isolating region being interposed between an associated one of the well regions and the semiconductor substrate and made of a semiconductor or an insulator of the opposite conductivity type to that of the well regions.

17. A method for driving a nonvolatile semiconductor memory device, the nonvolatile semiconductor memory device having an array of memory cells arranged in columns and rows over a well region of a semiconductor substrate, each said memory cell comprising:

a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film;

a select transistor including a second gate insulating film formed on the semiconductor substrate, and a select gate electrode formed on the second gate insulating film, the select transistor being disposed on the semiconductor substrate to be spaced apart from the memory transistor;

an intermediate diffusion layer formed in a region of the semiconductor substrate and located between the memory transistor and the select transistor; and source/drain diffusion layers formed in the semiconductor substrate to interpose a region underlying the memory transistor, a region underlying the select transistor and the intermediate diffusion layer therebetween, wherein the source/drain diffusion layers and the intermediate diffusion layer have an equal dopant concentration, and wherein the tunneling current, allowing electrons to pass from almost every portion of the surface of the first gate insulating film through the first gate insulating film located under the floating gate electrode of the memory transistor, is used while the electrons are ejected out of the floating gate electrode and while the electrons are injected into the floating gate electrode.

18. A method for driving a nonvolatile semiconductor memory device, the nonvolatile semiconductor memory device having an array of memory cells arranged in columns and rows over a semiconductor substrate, each said memory cell comprising:

a memory transistor including: a first gate insulating film, which is formed on the semiconductor substrate and has such a thickness as to allow tunneling current to pass therethrough; a floating gate electrode, which is formed on the first gate insulating film and where charges are storable; an interelectrode insulating film formed on the floating gate electrode; and a control gate electrode formed on the interelectrode insulating film; and source/drain diffusion layers formed in the semiconductor substrate to interpose a region underlying the memory transistor therebetween, wherein some of the memory cells which are arranged in columns are disposed on respective well regions, each of the well regions being divided into a plurality of electrically isolated regions parallel to respective bit lines, the well regions have potentials which are controllable independently of each other, source lines are disposed electrically independently in parallel to the respective bit lines, and wherein the tunneling current, allowing electrons to pass from almost every portion of the surface of the first gate insulating film through the first gate insulating film located under the floating gate electrode of the memory transistor, is used while the electrons are ejected out of the floating gate electrode and while the electrons are injected into the floating gate electrode.

19. The method of claim 18, wherein each said memory cell further comprises:

a select transistor including a second gate insulating film formed on the semiconductor substrate, and a select gate electrode formed on the second gate insulating film, the select transistor being disposed on the semiconductor substrate to be spaced apart from the memory transistor; and an intermediate diffusion layer formed in a region of the semiconductor substrate and located between the memory transistor and the select transistor.

* * * * *